(12) United States Patent
Jean et al.

(10) Patent No.: US 11,555,840 B2
(45) Date of Patent: Jan. 17, 2023

(54) ANISOTROPIC CONSTITUTIVE PARAMETERS FOR LAUNCHING A ZENNECK SURFACE WAVE

(71) Applicant: CPG Technologies, LLC, Italy, TX (US)

(72) Inventors: Buford Randall Jean, Lorena, TX (US); James D. Lilly, Waxahachie, TX (US); Benjamin J. Tinlin, Waco, TX (US)

(73) Assignee: CPG Technologies, LLC, Italy, TX (US)

( * ) Notice: Subject to any disclaimer, the term of this patent is extended or adjusted under 35 U.S.C. 154(b) by 0 days.

(21) Appl. No.: 17/683,847

(22) Filed: Mar. 1, 2022

(65) Prior Publication Data

US 2022/0214389 A1  Jul. 7, 2022

Related U.S. Application Data

(63) Continuation of application No. PCT/US2020/063930, filed on Dec. 9, 2020, which is
(Continued)

(51) Int. Cl.
*G01R 27/04* (2006.01)
*G01R 27/32* (2006.01)
(Continued)

(52) U.S. Cl.
CPC ............ *G01R 27/06* (2013.01); *G01R 21/00* (2013.01); *G01R 27/02* (2013.01); *G01R 27/18* (2013.01);
(Continued)

(58) Field of Classification Search
CPC .... G01R 27/06; G01R 27/18; G01R 27/2676; G01R 21/00; G01R 27/02; G01R 27/04;
(Continued)

(56) References Cited

U.S. PATENT DOCUMENTS

| 4,774,492 A | 9/1988 | Shier |
| 9,893,403 B2 | 2/2018 | Corum et al. |

(Continued)

FOREIGN PATENT DOCUMENTS

EP     3347942     7/2018

OTHER PUBLICATIONS

U.S. Appl. No. 13/789,538, filed Mar. 7, 2013.
(Continued)

*Primary Examiner* — Raul J Rios Russo
(74) *Attorney, Agent, or Firm* — Thomas|Horstemeyer, LLP; Mark A. Guetlich

(57) ABSTRACT

Various examples are provided related to anisotropic constitutive parameters (ACPs) that can be used to launch Zenneck surface waves. In one example, among others, an ACP system includes an array of ACP elements distributed above a medium such as, e.g., a terrestrial medium. The array of ACP elements can include one or more horizontal layers of radial resistive artificial anisotropic dielectric (RRAAD) elements positioned in one or more orientations above the terrestrial medium. The ACP system can include vertical lossless artificial anisotropic dielectric (VLAAD) elements distributed above the terrestrial medium in a third orientation perpendicular to the horizontal layer or layers. The ACP system can also include horizontal artificial anisotropic magnetic permeability (HAAMP) elements distributed above the terrestrial medium. The array of ACP elements can be distributed about a launching structure, which can be excited with an electromagnetic field to facilitate the launch of a Zenneck surface wave.

27 Claims, 11 Drawing Sheets

Related U.S. Application Data a continuation of application No. 16/708,048, filed on Dec. 9, 2019, now Pat. No. 11,340,275.

(51) Int. Cl.

| | |
|---|---|
| *G01R 27/06* | (2006.01) |
| *G01R 27/18* | (2006.01) |
| *G01R 27/26* | (2006.01) |
| *G01V 3/12* | (2006.01) |
| *G01V 3/38* | (2006.01) |
| *G01R 21/00* | (2006.01) |
| *G01R 27/02* | (2006.01) |
| *G01R 1/26* | (2006.01) |

(52) U.S. Cl.
CPC .......... *G01R 27/2676* (2013.01); *G01V 3/12* (2013.01); *G01V 3/38* (2013.01); *G01R 1/26* (2013.01); *G01R 27/04* (2013.01)

(58) Field of Classification Search
CPC . G01R 1/26; G01R 27/32; G01V 3/12; G01V 3/38
USPC .......... 324/76.11–76.83, 459, 600, 629, 637, 324/642, 645
See application file for complete search history.

(56) References Cited

U.S. PATENT DOCUMENTS

| | | | |
|---|---|---|---|
| 9,910,144 | B2 | 3/2018 | Corum et al. |
| 9,912,031 | B2 | 3/2018 | Corum et al. |
| 9,923,385 | B2 | 3/2018 | Corum et al. |
| 9,941,566 | B2 | 4/2018 | Corum et al. |
| 10,027,116 | B2 | 7/2018 | Corum et al. |
| 10,153,638 | B2 | 12/2018 | Corum et al. |
| 10,193,595 | B2 | 1/2019 | Corum et al. |
| 10,224,589 | B2 | 3/2019 | Corum et al. |
| 10,326,190 | B2 | 6/2019 | Corum et al. |
| 10,355,480 | B2 | 7/2019 | Corum et al. |
| 10,447,342 | B1 | 10/2019 | Corum et al. |
| 10,630,111 | B2 | 4/2020 | Corum et al. |
| 10,680,306 | B2 | 6/2020 | Corum et al. |
| 2003/0020655 | A1 | 1/2003 | McKinzie, III et al. |
| 2009/0078449 | A1 | 3/2009 | Hasegawa |
| 2009/0296237 | A1* | 12/2009 | Bowers .................. G02B 27/40 359/724 |
| 2012/0105970 | A1 | 5/2012 | Ueda |
| 2014/0252865 | A1 | 9/2014 | Corum et al. |
| 2014/0252886 | A1 | 9/2014 | Corum et al. |
| 2016/0072300 | A1 | 3/2016 | Corum et al. |
| 2016/0079754 | A1 | 3/2016 | Corum et al. |
| 2016/0359335 | A1 | 12/2016 | Corum et al. |
| 2016/0359336 | A1 | 12/2016 | Corum et al. |
| 2017/0077616 | A1 | 3/2017 | Corum |
| 2017/0077893 | A1 | 3/2017 | Corum et al. |
| 2018/0151934 | A1 | 5/2018 | Corum et al. |
| 2018/0166884 | A1 | 6/2018 | Corum et al. |
| 2018/0180729 | A1 | 6/2018 | Corum et al. |
| 2018/0183128 | A1 | 6/2018 | Corum et al. |
| 2018/0198183 | A1 | 7/2018 | Corum et al. |
| 2018/0262053 | A1 | 9/2018 | Corum et al. |
| 2018/0309289 | A1 | 10/2018 | Corum et al. |
| 2019/0058327 | A1 | 2/2019 | Corum et al. |
| 2019/0132025 | A1 | 5/2019 | Corum et al. |
| 2019/0179000 | A1* | 6/2019 | Adolf .................. H01Q 1/362 |
| 2019/0181530 | A1* | 6/2019 | Adolf .................. H01P 5/08 |
| 2019/0181531 | A1* | 6/2019 | Adolf .................. H01Q 1/362 |
| 2019/0181686 | A1* | 6/2019 | Adolf .................. H01P 3/08 |
| 2019/0379096 | A1 | 12/2019 | Othmezouri |
| 2020/0028273 | A1 | 1/2020 | Legay et al. |
| 2020/0287264 | A1 | 9/2020 | Corum et al. |
| 2020/0388896 | A9 | 12/2020 | Corum et al. |

OTHER PUBLICATIONS

U.S. Appl. No. 15/894,176, filed Feb. 12, 2018.
U.S. Appl. No. 13/789,525, filed Mar. 7, 2013.
U.S. Appl. No. 15/894,145, filed Feb. 12, 2018.
U.S. Appl. No. 14/483,089, filed Sep. 10, 2014.
U.S. Appl. No. 15/915,507, filed Mar. 8, 2018.
U.S. Appl. No. 16/289,954, filed Mar. 1, 2019.
U.S. Appl. No. 14/848,653, filed Sep. 9, 2015.
U.S. Appl. No. 16/017,516, filed Jun. 25, 2018.
U.S. Appl. No. 16/168,248, filed Oct. 23, 2018.
U.S. Appl. No. 14/728,507, filed Jun. 2, 2015.
U.S. Appl. No. 16/234,086, filed Dec. 27, 2018.
U.S. Appl. No. 14/728,492, filed Jun. 2, 2015.
U.S. Appl. No. 15/889,827, filed Feb. 6, 2018.
U.S. Appl. No. 15/238,041, filed Aug. 16, 2016.
U.S. Appl. No. 15/878,607, filed Jan. 24, 2018.
U.S. Appl. No. 15/909,596, filed Mar. 1, 2018.
U.S. Appl. No. 16/881,120, filed May 22, 2020.
International Search and Written Opinion for PCT/US2020/063930 dated Mar. 5, 2021.
Ozgun et al., Utilization of Anisotropic Metamaterial Layers in Waveguide Miniaturization and Transitions, IEEE Microwave and Wireless Components Letters, Nov. 5, 2007, pp. 754-756, vol. 17, No. 11.
Ozgun et al., Form Invariance of Maxwell's Equations—The Pathway to Novel Metamaterial Specifications for Electromagnetic Reshaping, IEEE Antennas and Propagation Magazine, Jun. 1, 2010, pp. 51-65, vol. 52, Issue 3.
Hendry, Janice, Isolation of the Zenneck Surface Wave, 2010 Loughborough Antennas & Propagation Conference, Nov. 8, 2010, pp. 613-616, Loughborough, UK.
Jiang et al., A Highly-confined Dielectric Waveguide Enabled by Conformal Anisotropic Impedance Surfaces, IEEE, Oct. 19, 2017, pp. 1493-1494.
Vytovtov et al., Penetration Effect: Exotic Behavior of a Wave in Anisotropic Media, International Journal of Microwave Science and Technology, Feb. 15, 2017, pp. 1-7, vol. 2017.
Mesa et al., Excitation of the Zenneck Wave by a Tapered Line Source, 2019 IEEE/MTT-S International Microwave Symposium, May 7, 2019.
International Search Report for PCT/US2020/0639301 dated Mar. 5, 2021.

* cited by examiner

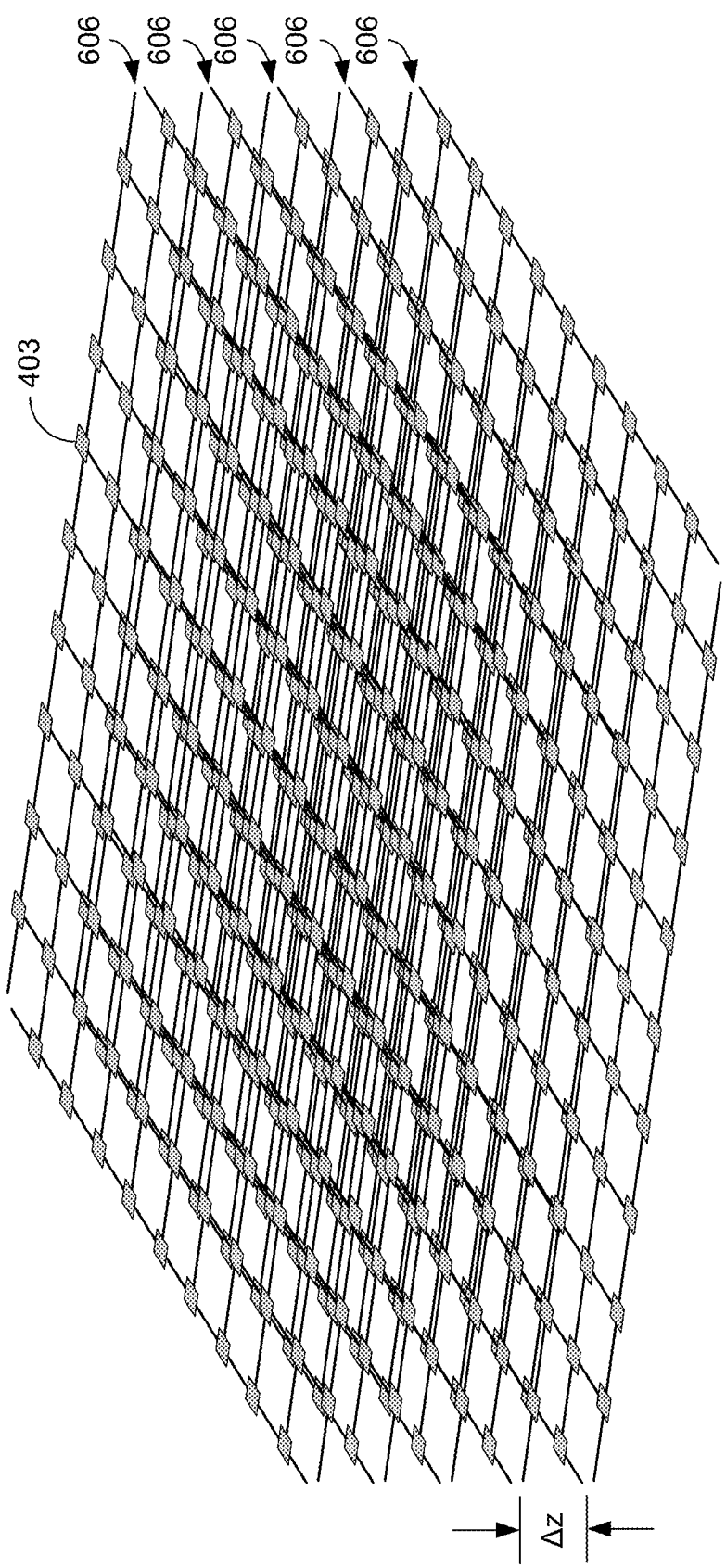

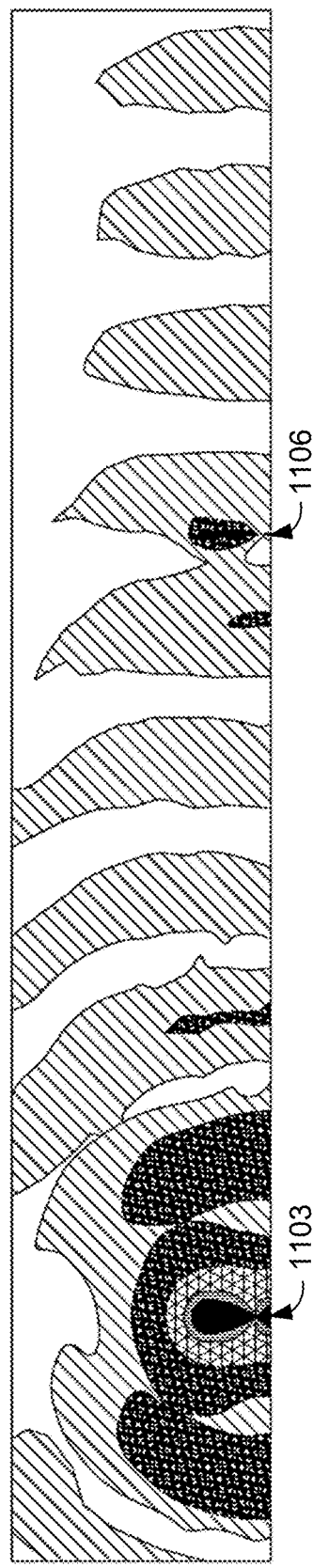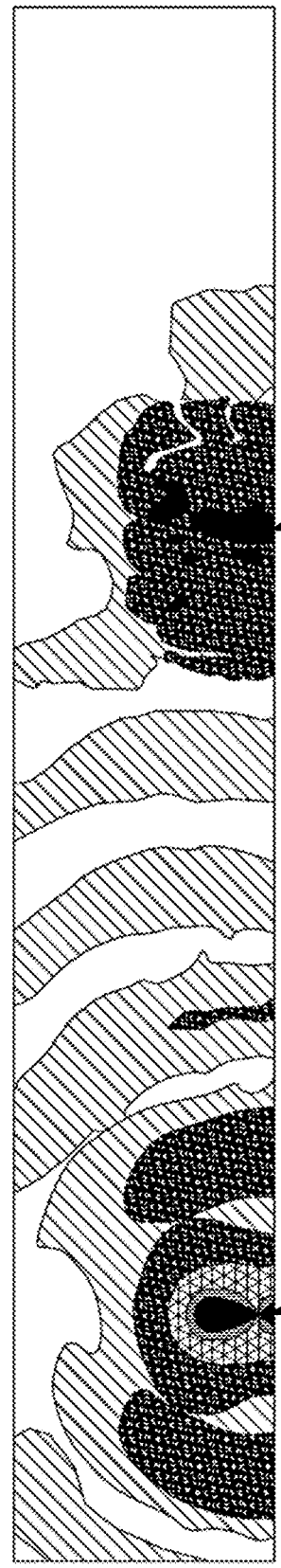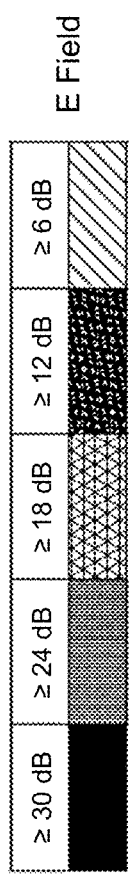
FIG. 9A
FIG. 9B

ANISOTROPIC CONSTITUTIVE PARAMETERS FOR LAUNCHING A ZENNECK SURFACE WAVE

CROSS REFERENCE TO RELATED APPLICATIONS

This application is a continuation application claiming priority to, and the benefit of, co-pending international patent application entitled "Anisotropic Constitutive Parameters for Launching a Zenneck Surface Wave" having serial no. PCT/US2020/063930, filed Dec. 9, 2020, which claims priority to, and the benefit of, co-pending U.S. non-provisional application having Ser. No. 16/708,048, filed Dec. 9, 2019, both of which are hereby incorporated by reference in their entireties.

BACKGROUND

Jonathan Zenneck first published the basic theory of the properties of a Zenneck surface wave (ZSW) in 1907. The Zenneck solution to the wave equation, as derived from Maxwell's field equations, exactly describes in theoretical mathematics the properties and behavior of such waves in terms of the directional propagation constants and the impedance relationships among the various electric and magnetic vector field components. The term "Zenneck surface wave" (ZSW) refers to a unique mode of wave propagation wherein electromagnetic energy is guided from point to point by and along the interface between lossy and lossless dielectrics such as the earth and air. Conventional power-line delivery of electrical energy is accomplished through electromagnetic waves that are guided by the transmission line wires that span from tower to tower or pole to pole. Radiated electrical energy, like that used for radio, television and cell phones, is unguided and spreads out in all directions as it travels, being reflected and refracted in multiple directions as it encounters the surface of the earth and other objects.

ZSWs exist in the domain between conductor-guided waves and waves that are launched and propagate from antennas. Specifically, a ZSW takes advantage of the electrical current densities that are induced in the surface of the earth whenever a wave strikes the earth with propagation characteristics comprising the complex Brewster's angle of incidence with the surface. A familiar Brewster effect is seen when light strikes the highway at an angle such that the reflection appears like it is coming from a pond of water, or even a mirror, lying in the plane of the roadway. The "complex" feature of the Brewster's angle needed for a ZSW refers to the phase relationships that exist among the field components comprising the Zenneck surface wave.

SUMMARY

Aspects of the present disclosure are related to systems, methods and apparatus comprising anisotropic constitutive parameter (ACP) elements that can be used to launch or receive Zenneck surface waves (ZSWs), or other types of surface waves. In one aspect, among others, a guided surface wave apparatus comprises a launching structure or a receiving structure; and an array of anisotropic constitutive parameter (ACP) elements distributed above a terrestrial medium about the launching structure or the receiving structure, the array of ACP elements comprising: a first plurality of radial resistive artificial anisotropic dielectric (RRAAD) elements positioned above the terrestrial medium, the first plurality of RRAAD elements comprising one or more series of interconnected RRAAD elements extending in a first orientation, wherein the first plurality of the RRAAD elements forms a horizontal layer at a height above the terrestrial medium. In one or more aspects, the array of ACP elements can be a cylindrical array with each of the one or more series of interconnected RRAAD elements linearly oriented in a $\rho$-direction.

In various aspects, the array of ACP elements can comprise a second horizontal layer of RRAAD elements positioned above, and substantially parallel to, the horizontal layer of RRAAD elements distributed at the height above the terrestrial medium. The second horizontal layer of RRAAD elements can comprise a second plurality of RRAAD elements positioned above the first plurality of RRAAD elements in the horizontal layer, the second plurality of RRAAD elements comprising one or more series of interconnected RRAAD elements extending in the first orientation. The array of ACP elements can comprise a second plurality of RRAAD elements positioned above the terrestrial medium, the second plurality of RRAAD elements comprising one or more series of interconnected RRAAD elements extending in a second orientation with respect to the first orientation, wherein the first plurality of the RRAAD elements and the second plurality of the RRAAD elements form the horizontal layer at the height above the terrestrial medium. RRAAD elements of the one or more series of interconnected RRAAD elements of the first plurality of RRAAD elements and the one or more series of interconnected RRAAD elements of the second plurality of RRAAD elements can be separated from adjacent elements in that series by a defined distance. The array of ACP elements can be a rectangular array with the one or more series of interconnected RRAAD elements of the first plurality of RRAAD elements linearly oriented in an x-direction and the one or more series of interconnected RRAAD elements of the second plurality of RRAAD elements linearly oriented in a y-direction substantially perpendicular to the x-direction.

In some aspects, the launching structure can be configured to excite the array of ACP elements with an electromagnetic field at a frequency ($f_o$) thereby substantially mode matching the electromagnetic field to a Zenneck surface wave mode of the terrestrial medium. The receiving structure can be configured to couple with a Zenneck surface wave propagating along the terrestrial medium at a frequency ($f_o$) via the array of ACP elements, wherein the array of ACP elements is configured to concentrate electromagnetic energy from the Zenneck surface wave around the receiving structure. Individual RRAAD elements of the array of ACP elements can comprise a capacitor and a resistor connected in parallel, the capacitor and resistor comprising one or more lumped element components. The array of ACP elements can comprise a plurality of vertical lossless artificial anisotropic dielectric (VLAAD) elements distributed above the terrestrial medium, the plurality of VLAAD elements positioned above the terrestrial medium, the plurality of VLAAD elements comprising one or more series of interconnected VLAAD elements extending in a second orientation substantially perpendicular to the horizontal layer. The guided surface wave apparatus can comprise an array of horizontal artificial anisotropic magnetic permeability (HAAMP) elements distributed about the launching structure or the receiving structure, the array of HAAMP elements comprising a plurality of HAAMP elements positioned above the terrestrial medium.

In another aspect, a method comprises providing a plurality of anisotropic constitutive parameter (ACP) elements about a launching structure or a receiving structure; and configuring the plurality of ACP elements in an array above a terrestrial medium, wherein configuring the array of ACP elements comprises: positioning a first plurality of radial resistive artificial anisotropic dielectric (RRAAD) elements above the terrestrial medium, the first plurality of RRAAD elements comprising one or more series of interconnected RRAAD elements extending in a first orientation, the first plurality of the RRAAD elements forming a horizontal layer at a height above the terrestrial medium. In one or more aspects, the method can comprise exciting the array of ACP elements with an electromagnetic field produced by the launching structure, the array of ACP elements configured to substantially mode match the electromagnetic field at a frequency ($f_o$) to a Zenneck surface wave mode of the terrestrial medium; and coupling energy from the launching structure into a Zenneck surface wave propagating along the terrestrial medium via the array of ACP elements. The method can comprise concentrating, via the array of ACP elements, electromagnetic energy from a Zenneck surface wave propagating along the terrestrial medium at a frequency ($f_o$); extracting power from the concentrated electromagnetic energy from the Zenneck surface wave via the receiving structure; and providing at least a portion of the extracted power to a load.

In various aspects, the array of ACP elements can be a cylindrical array with each of the one or more series of interconnected RRAAD elements linearly oriented in a ρ-direction. Configuring the array of ACP elements can comprise positioning a second plurality of RRAAD elements in a second horizontal layer above, and substantially parallel to, the horizontal layer of RRAAD elements distributed at the height above the terrestrial medium. The second plurality of RRAAD elements can comprise one or more series of interconnected RRAAD elements extending in the first orientation. The second plurality of RRAAD elements can comprise one or more series of interconnected RRAAD elements extending in a second orientation with respect to the first orientation. The array of ACP elements can be a rectangular array with the one or more series of interconnected RRAAD elements of the first plurality of RRAAD elements linearly oriented in an x-direction and the one or more series of interconnected RRAAD elements of the second plurality of RRAAD elements linearly oriented in a y-direction substantially perpendicular to the x-direction.

In some aspects, configuring the array of ACP elements can comprise positioning a plurality of vertical lossless artificial anisotropic dielectric (VLAAD) elements distributed about the launching structure or the receiving structure, the plurality of VLAAD elements positioned above the terrestrial medium, the plurality of VLAAD elements comprising one or more series of interconnected VLAAD elements extending in a second orientation substantially perpendicular to the horizontal layer. The method can comprise configuring an array of horizontal artificial anisotropic magnetic permeability (HAAMP) elements about the launching structure or the receiving structure, the array of HAAMP elements comprising a plurality of HAAMP elements positioned above the terrestrial medium.

In another aspect, a guided surface wave system comprises an array of anisotropic constitutive parameter (ACP) elements distributed above a terrestrial medium about a launching structure, the array of ACP elements comprising a first plurality of radial resistive artificial anisotropic dielectric (RRAAD) elements positioned above the terrestrial medium, the first plurality of RRAAD elements comprising one or more series of interconnected RRAAD elements extending in a first orientation, wherein the first plurality of the RRAAD elements forms a horizontal layer at a height above the terrestrial medium, where excitation of the array of ACP elements with an electromagnetic field produced by the launching structure at a frequency ($f_o$) substantially mode matches the electromagnetic field to a Zenneck surface wave mode of the terrestrial medium; and a receiving structure configured to extract power from electromagnetic energy from a Zenneck surface wave propagating along the terrestrial medium from the launching structure. In one or more aspects, the guided surface wave system can comprise a second array of ACP elements distributed above the terrestrial medium about the receiving structure, the second array of ACP elements configured to configured to concentrate the electromagnetic energy from the Zenneck surface wave around the receiving structure, wherein the receiving structure extracts power from the concentrated electromagnetic energy from the Zenneck surface wave.

In various aspects, the array of ACP elements can comprise a second horizontal layer of RRAAD elements positioned above, and substantially parallel to, the horizontal layer of RRAAD elements distributed at the height above the terrestrial medium, the second horizontal layer of RRAAD elements comprising a second plurality of RRAAD elements positioned above the first plurality of RRAAD elements in the horizontal layer. The array of ACP elements can comprise a second plurality of RRAAD elements positioned above the terrestrial medium, the second plurality of RRAAD elements comprising one or more series of interconnected RRAAD elements extending in a second orientation with respect to the first orientation, wherein the first plurality of the RRAAD elements and the second plurality of the RRAAD elements form the horizontal layer at the height above the terrestrial medium. The array of ACP elements can comprise a plurality of vertical lossless artificial anisotropic dielectric (VLAAD) elements distributed above the terrestrial medium, the plurality of VLAAD elements positioned above the terrestrial medium, the plurality of VLAAD elements comprising one or more series of interconnected VLAAD elements extending in a second orientation substantially perpendicular to the horizontal layer. In some aspects, the guided surface wave system can comprise an array of horizontal artificial anisotropic magnetic permeability (HAAMP) elements distributed about the launching structure, the array of HAAMP elements comprising a plurality of HAAMP elements positioned above the terrestrial medium.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 6C illustrates a three-dimensional rectangular coordinate arrangement of ACP elements, according to various embodiments of the present disclosure.

FIGS. 9A and 9B illustrate a comparison of simulation results for a simple receiving structure that employs a monopole antenna according to a conventional receiver versus a receiving structure that employs ACP elements (VLAAD and HAAMP) to concentrate the signal around a receiving structure, according to various embodiments of the present disclosure.

DETAILED DESCRIPTION

Figure 1:
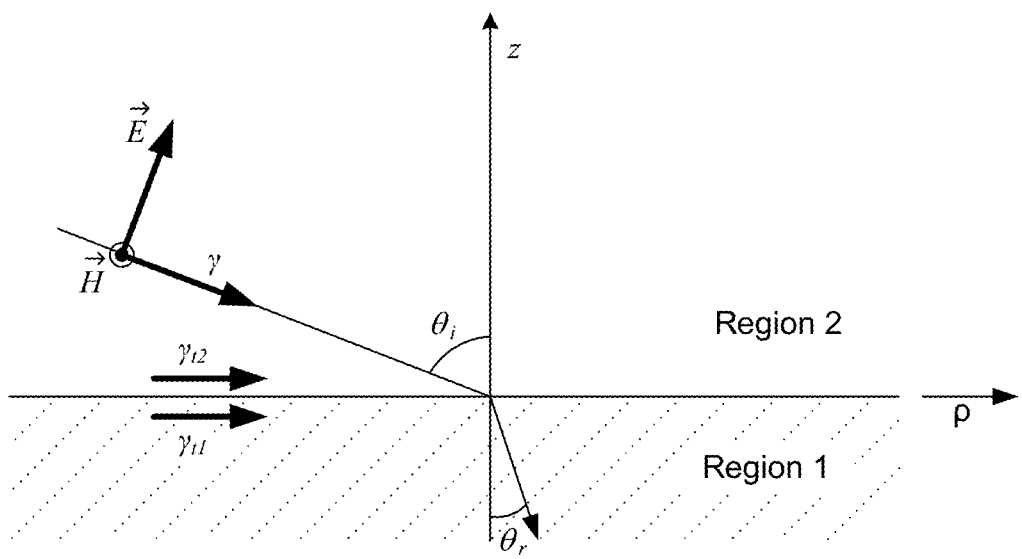
FIG. 1 illustrates a propagation interface with two regions employed for transmission of a Zenneck surface wave (ZSW), according to various embodiments of the present disclosure.

Disclosed herein are various examples related to anisotropic constitutive parameter (ACP) elements to form an ACP system that can be used to launch or receive Zenneck surface waves (ZSWs), or other types of surface waves. A ZSW, in the context of this disclosure, is a surface wave that is guided by and bound to the abrupt interface between two media such as, e.g., air and earth without radiation. The interface itself can be defined in terms of the discontinuity found between the electrical properties of the boundary media, such as lossy dielectrics, lossless dielectrics or combinations of both (e.g., the atmosphere and the complex electrical properties of the terrestrial media or earth). Examples of other surface waves include, but are not limited to, Dyakonov waves which generally propagate on the interface between an anisotropic dielectric and an isotropic dielectric, or Sommerfeld-Goubau waves, which propagate on a metal surface coated in a thin layer of low-loss dielectric. These surface waves propagate on surfaces without radiation, but the difference lies in the properties of the materials making up the interface (e.g., one medium is a lossless material and the other medium is a lossy dielectric). Reference will now be made in detail to the description of the embodiments as illustrated in the drawings, wherein like reference numbers indicate like parts throughout the several views.

The primary field component for a ZSW is a time-varying, transverse magnetic field that encircles the cylindrical ZSW launching structure. According to Maxwell's equations, this time-varying magnetic field, which is typically designated by the symbol $H_\phi$, creates time-varying electric fields that are everywhere perpendicular to the magnetic field. There are two electric fields created. One field, called $E_z$, points perpendicular to the surface of the interface (e.g., the earth). A much smaller secondary field, denoted by $E_\rho$, points in the radial travel direction of the ZSW. Electrical power that moves from point to point along the interface (or guiding) surface (e.g., of the earth) is carried by $E_z$ and $H_\phi$. Even though $E_\rho$ is much smaller than $E_z$, establishing the correct $E_\rho$ is significant to launching a ZSW. When the $E_\rho$ for launching the ZSW is achieved, the energy in the wave follows the contours of the guiding surface (e.g., of the earth) rather than radiating away from the surface into space.

Energy transfer is possible along a guiding surface capable of supporting a ZSW. A lossy and/or lossless dielectric interface can be used to support the ZSW, and regardless of the geometry of the interface (whether rectangular, spherical, disk-shaped, etc.), a standing wave is established for efficient power transfer to be achieved on that particular guiding surface. For efficient energy transfer on a global scale, the ZSW can completely span the globe. To achieve global coverage, the frequency of the ZSW will be in the low kilohertz (kHz) frequency range, typically 10 kHz or less. This low frequency is driven by the amount of attenuation that is experienced as the wave travels along the surface of the earth. At higher frequencies, the attenuation factor can be so large that all of the energy put in the ZSW that is not captured by a receiver gets absorbed by the earth. At the lower frequencies, a global standing wave can be established such that a very small amount of energy gets lost due to heat in the earth, and a receiver or receiving structure can extract energy from the standing wave when and where a need arises. In the case of a designed guiding surface, where the conductivity and permittivity values for the dielectric interface can be specified by a designer rather than designed around, the amount of attenuation may be reduced or minimized by the design of the guiding surface.

The launching structure for a ZSW is not an antenna, rather it is a coupling probe that connects the energy source to a guiding surface such as, e.g., the air in contact with and immediately above the surface of the earth or other appropriate lossy and/or lossless interface. While the size of the coupling probe does depend upon the frequency of operation, it will be much smaller than an equivalent radiating antenna would be, if the antenna were designed to transmit the same level of power with the same efficiency in free space. The energy radiated from such an antenna would further be dispersed in all directions and mostly unavailable for capture by a receiver located on the earth. Small size, controlled dispersion, low attenuation, and efficient operation are all features of ZSW systems that make them attractive for a wide range of applications that move energy and/or information from one point to another over (or within an effective proximity to) the surface of a lossy dielectric such as the earth. If ACP structures are employed, the size of a radiating antenna or coupling probe can be further reduced while preserving the antenna or coupling probe performance.

Begin by considering boundary conditions as illustrated in FIG. 1, where an incident wave meets a boundary between region 2 and region 1 (e.g., air and earth). The condition of no radiation means that no reflection of the incident wave takes place; that is, the reflection coefficient at the surface of the boundary is zero, $\Gamma_s=0$. A ZSW can be obtained when the reflection coefficient presented to a vertically-polarized transverse magnetic wave impinging upon the earth has a value of zero (or substantially zero). It is understood that while absolute numbers are presented here, numbers that are approximately equal to the values stated may suffice to provide the desired effect.

The propagation properties of a ZSW can be derived by considering an incident plane wave. The incident wave comprises an electric field ($\vec{E}$) that lies in the plane of incidence, which is defined by a propagation constant vector ($\gamma$) of the incident field and a normal (z) to the surface of the boundary. In addition, a magnetic field ($\vec{H}$) extends out of the plane of incidence (perpendicular to $\vec{E}$), providing a transverse magnetic (TM) wave for the case in which the wavefront is an inhomogeneous plane wave. The angle between the propagation constant vector and the normal is the incident angle ($\theta_i$) or angle of incidence. The length (or magnitude) of the propagation constant vector is controlled by the properties of the medium. For example, in air in the absence of a boundary $\gamma=\gamma_o=j\omega\sqrt{\mu_o\varepsilon_o}$, and the intrinsic impedance is given by $\eta_o=\sqrt{\mu_o\varepsilon_o}$, where $\omega$ is equal to $2\pi f$ of frequency f, $\mu_o$ is the permeability of free space and $\varepsilon_o$ is the permittivity of free space. For a guided wave, such as a ZSW, the propagation constant and impedance are modified by the presence of the guiding boundary at the interface, e.g., between the air and earth. Since $\delta_{TM\_s}=0$ for a ZSW, there is no reflected wave and the transmitted wave propagates below the surface of the boundary at the refracted angle ($\theta_r$) or angle of refraction. For this condition to be obtained, the nature of the incident wave in region 2 is such that the wave is of an inhomogeneous characteristic. Such a wave has a component of electric field in the horizontal direction ($\rho$) that is out of phase with the electric field in the vertical (z) direction.

If region 1 is the earth, then $\mu=\mu_o$ and $\varepsilon=\varepsilon_o(\varepsilon_r-j\sigma/\omega\varepsilon_o)$, where $\varepsilon_r$ is the relative permittivity and $\sigma$ is the conductivity of the earth. Define $\kappa=\varepsilon_r-j\sigma/\omega\varepsilon_o$, which includes a real part representing the energy storage portion and an imaginary part representing the energy loss portion. Thus, in the earth, the unbounded wave value of the propagation constant is $\gamma_e=\gamma_o\kappa^{1/2}$ and the intrinsic impedance of the earth is $\eta_e=\eta_o/\kappa^{1/2}$.

The conditions that are imposed upon the electric and magnetic fields of a wave that is incident upon an interface between electrically dissimilar materials can be expressed in two fundamental relationships. First, the tangential components of both the electric and magnetic field vectors are always equal in each of the two media at the interface. This boundary condition is derived from the integral form of Maxwell's curl equations for $\vec{E}$ and $\vec{H}$, where $\vec{E}$ is the electric field vector and $\vec{H}$ is the magnetic field vector.

The second fundamental relationship is that the values of the vector projections of the complex wave propagation constants in the direction parallel to the interface exactly match on both sides of the boundary (i.e., $\gamma_{t2}=\gamma_{t1}$) as illustrated in FIG. 1, where the vector projections $\gamma_{t2}=\gamma_o \sin\theta_i$ and $\gamma_{t1}=\gamma_e \sin\theta_r$. This second condition is an outcome of the fact that the field matching boundary conditions are satisfied for all positions and at all times. For this relationship to be met, any wave having a propagating component that is traveling parallel to the boundary in either medium moves with the same phase velocity and attenuates in amplitude as a function of position in exactly the same way. All waves of any type always obey these two fundamental constraints.

To get a ZSW, the vertical projection of the intrinsic impedance of regions 1 and 2 are the same. In other words, the projection of the electric field $\vec{E}$ that is perpendicular to $\vec{H}$ and parallel to the boundary surface (i.e., the portion of the electric field pointing in the $\rho$ direction, $E_\rho$) forms a surface impedance $\eta_s$. In region 2, $\eta_s=\eta_o \cos\theta_i$. In region 1, $\eta_s=\eta_e \cos\theta_r$. So, the reflection coefficient can be expressed as:

$$\Gamma_{TM\_s} = \frac{\eta_e \cos\theta_r - \eta_o \cos\theta_i}{\eta_e \cos\theta_r + \eta_o \cos\theta_i} \quad (1)$$

To achieve a ZSW, $\Gamma_{TM\_s}=0$ (or substantially zero). With the vector projections at the boundary being $\gamma_{t2}=\gamma_{t1}$, then $\gamma_o \sin\theta_i=\gamma_e \sin\theta_r$. Using this equality and the projected impedances for air and earth in terms of $\kappa=\varepsilon_r-j\sigma/\omega\varepsilon_o$ gives the following relationships:

$$\sin\theta_i = \left\{\frac{\kappa}{\kappa+1}\right\}^{1/2} = \cos\theta_r \quad (2)$$

$$\sin\theta_r = \left\{\frac{1}{\kappa+1}\right\}^{1/2} = \cos\theta_i \quad (3)$$

Note that the angles of incidence ($\theta_i$) and refraction ($\theta_r$) sum to ninety degrees ($\theta_i+\theta_r=90°$). Because the projection of the intrinsic impedance of, e.g., the earth $\eta_e$ is a complex number, the projection of the intrinsic impedance $\eta_o$ is also complex to achieve $\Gamma_{TM\_s}=0$. Thus, there is $\theta_i=\theta_{i_{real}}-j\theta_{i_{imaginary}}$ and $\theta_r=\theta_{r_{real}}-j\theta_{r_{imaginary}}$. The imaginary components are equal ($\theta_{i_{imaginary}}=\theta_{r_{imaginary}}$) and of opposite sign, and the real components sum to ninety degrees ($\theta_{i_{real}}+\theta_{r_{real}}=90°$).

Consider a wave described in cylindrical coordinates. To get the value of $E_\rho$ in, e.g., air and earth, when $H_\phi$ is known, multiply $H_\phi$ by the cosine projection of the impedance, i.e., the impedance that is in the direction normal to the boundary, in each medium to get $$E_{\rho,a} = \eta_0 H_\phi \cos\theta_i = \eta_0 H_\phi \left(\frac{1}{\kappa+1}\right)^{1/2} \quad (4)$$

$$E_{\rho,e} = \frac{\eta_0}{\kappa^{1/2}} H_\phi \cos\theta_r = \eta_0 H_\phi \left(\frac{1}{\kappa+1}\right)^{1/2} \quad (5)$$

where $\eta_0$ is the intrinsic impedance of vacuum. This result is pleasing since $E_\rho$ and $H_\phi$ are continuous (i.e., equal) across the boundary.

Following a similar procedure, taking the projection according to the sine of the angles gives the value of $E_z$ on both sides of the boundary:

$$E_{z,a} = \eta_0 H_\phi \sin\theta_i = \eta_0 H_\phi \left(\frac{\kappa}{\kappa+1}\right)^{1/2} \tag{6a}$$

$$E_{z,e} = \frac{\eta_0}{\kappa^{1/2}} H_\phi \sin\theta_r = \frac{\eta_0}{\kappa^{1/2}} H_\phi \left(\frac{1}{\kappa+1}\right)^{1/2} = \frac{E_{z,a}}{\kappa} \tag{6b}$$

This relationship is also a satisfying result in that it is an alternative statement that the value of electric flux density $D_z$ is continuous across the boundary. Note that the fields in region 2 are governed by the value of the complex Brewster's angle in, e.g., the air, whereas the fields in region 1 are governed by the complement of that value in, e.g., the earth. If different materials are present in region 1 and/or 2, the characteristics of the materials will affect the terms in equations (4)-(6b).

There is a further understanding of the wave impedance values shown above for cylindrical ZSWs. For the $E_\rho$ and $H_\phi$ field components, the solution to the wave equation for both $E_\rho$ and $H_\phi$ have the same Hankel function dependence in the $\rho$ direction and the same complex exponential dependences in the $\pm z$ directions. As a consequence, the wave impedance for the vertically propagating components of the fields of a Zenneck surface wave are independent of radial or vertical position. The wave impedance for field components that constitute propagation in the horizontal direction is controlled by the ratio of the derivative of the Hankel function to its undifferentiated value and is therefore a function of distance from the origin in the $\rho$ direction. The relationships given by equations (6a) and (6b) are for the large argument asymptotic values of the Hankel function and its derivative with respect to $\rho$.

The boundary matching relationship imposes a constraint upon the behavior of the fields and the wave propagation constant in region 2 (e.g., the air) that can be described as anisotropic in the z and $\rho$ directions. In other words, the complex wave impedances and the propagation constants in these two directions are different. Once the surface wave is launched, the electrical current densities that are produced in the guiding surface (e.g., the earth) continue to assure that these anisotropic wave guiding conditions are met. These currents in region 1 (e.g., the earth) may be considered as forming an aperture that continually launches a backward traveling wave in region 2 (e.g., the air) that impinges upon the interface at the complex Brewster's angle. A launching structure, however, can create this anisotropic impedance relationship among the wave components in region 2 (e.g., the air) such that the proper current densities are produced by the electromagnetic energy that is applied to the launching structure. In other words, the impedance and propagation constant projections are "artificially" created in region 2 (e.g., the air) by the launching structure to effectively mode match to region 1 (e.g., the earth) to create a ZSW.

Figure 2A:
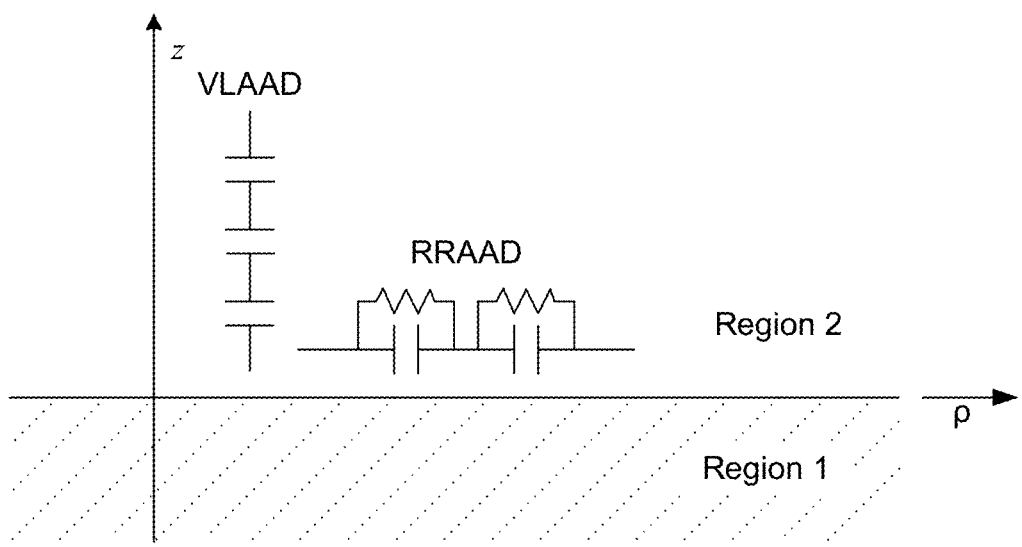
FIG. 2A illustrates an example of anisotropic constitutive parameter (ACP) elements including vertical lossless artificial anisotropic dielectric (VLAAD) and radial resistive artificial anisotropic dielectric (RRAAD) elements, according to various embodiments of the present disclosure.

This anisotropic impedance condition can be achieved by creating anisotropic constitutive parameters (ACPs) in region 2 (e.g., the air). Polarizable elements can be introduced above the surface of the boundary to "artificially" adjust (or synthesize) the impedance condition to control the angle of incidence $\theta_i$. These ACP elements can be introduced in the vertical direction (z) normal to the boundary surface and/or in the horizontal direction ($\rho$) along or parallel with the boundary surface as illustrated in FIG. 2A to achieve the desired conditions. Using vertically oriented ACP elements, the permittivity can be changed in the vertical direction (z) normal to the boundary surface, which affects the impedance in the $\rho$ direction and the propagation constant in the $\rho$ direction. Using horizontally oriented ACP elements, the impedance in the z direction and the propagation constant in the z direction can be impacted. By adjusting the ACP elements oriented in the vertical and/or horizontal directions (z and/or $\rho$), the angle of incidence $\theta_i$ can be changed. By controlling a combination of vertically and horizontally oriented ACP elements, it is possible to independently control the propagation constants in the vertical and horizontal directions (z and $\rho$). In the example of FIG. 2A, the vertically oriented ACP elements are identified as VLAAD for vertical lossless artificial anisotropic dielectric, and the horizontally oriented ACP elements are identified as RRAAD for radial resistive artificial anisotropic dielectric. For some applications, the RRAAD elements can also be lossless, particularly for the case wherein the VLAAD elements are selected to have a relative permittivity that is higher than that of region 1 (e.g., the earth).

Figure 2B:
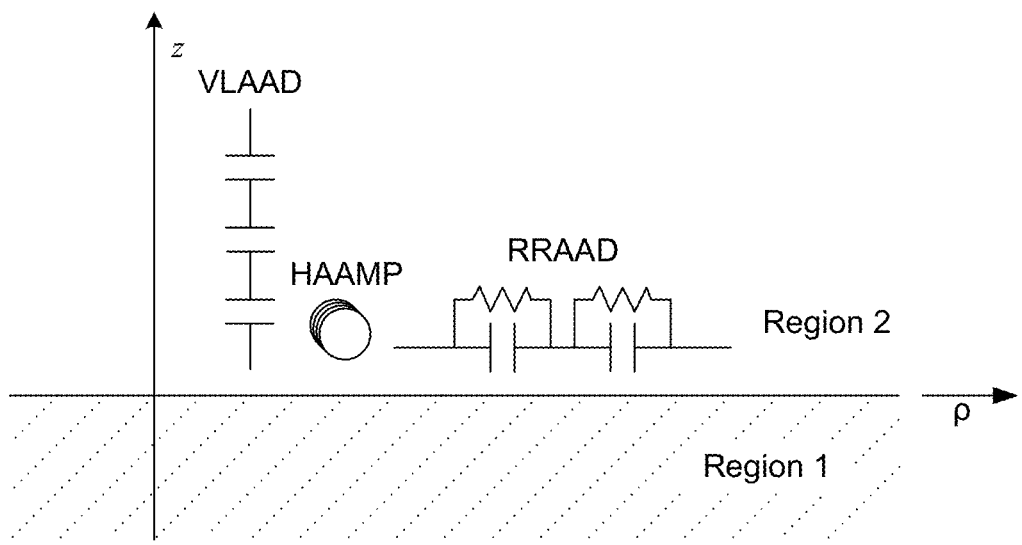
FIG. 2B illustrates an example of the ACP elements of FIG. 2A including an example of horizontal artificial anisotropic magnetic permeability (HAAMP) elements, according to various embodiments of the present disclosure.

As illustrated in FIG. 2B, additional horizontal $\phi$-directed magnetic field energy storage elements can be used to further modify the propagation constant in the $\rho$ direction and to match the $\rho$-directed impedance to the intrinsic impedance of region 2 (e.g., the air). Since these elements interact with the magnetic field strength and store energy coupled from the magnetic field, they can increase the effective magnetic permeability in the $\phi$ direction. They are thus identified as horizontal artificial anisotropic magnetic permeability (HAAMP) elements.

The ACP can be fabricated using conventional electrical components, naturally anisotropic materials, or other engineered anisotropic materials (e.g., isotropic materials arranged to produce bulk anisotropic effects) that are arranged geometrically such that the wave impedances observed in the z and $\rho$ directions within the volume of the ACP are distinct. HAAMP elements can be similarly configured using lumped element electrical components (or naturally or engineered anisotropic materials) to give the desired effect in the direction only. The ACP can also utilize other ways to realize the "artificial" (or synthesized) permittivity and conductivity elements. For example, conductive inclusions in a matrix (e.g., printed circuitry constructions) or bulk dielectrics can be configured to provide the desired anisotropy. These implementations can be beneficial in higher frequency applications where the use of lumped elements may not be feasible. To create the desired wave impedance property in the z direction within the anisotropic volume in region 2 (e.g., the air), polarizable elements can be arranged in the $\rho$ direction comprising unit cells fabricated from lengths of conducting wires, rods, or plates. These polarizable elements are much shorter than a wavelength of the propagating wave (e.g., less than $0.25\lambda$, less than $0.1\lambda$, or shorter), and can be connected in series to lumped or distributed resistive and capacitance elements forming cells that can be dispersed in a periodic (or perhaps sparse) array to form a grid-like structure. The grid-like structure, having such a distributed polarization property, will behave electrically as a homogeneous dielectric material whose complex permittivity value is governed by the polarizability of each of the unit cells. To effectively launch a Zenneck surface wave (ZSVV), a real part of the artificially created (or synthesized) permittivity value (in the $\rho$ direction) is adjusted to correspond to (or equal) the local value of the region 1 (e.g., the earth's) surface effective permittivity and an imaginary part of the artificially created permittivity value, which produces a loss characteristic, is adjusted to correspond to (or equal) the local value of the effective loss characteristic of region 1 (e.g., the earth).

If a lumped element is placed in series along a wire oriented in a certain direction, that lumped element will only have a voltage placed across it when an electric field parallel to the wire is present. By placing three wires orthogonally to one another and placing lumped components in parallel along these wires, it is possible to establish an effective R, L, and C for a given region in space spanned by the wires connected to the lumped components. If this region in space is small with respect to a wavelength (e.g., less than 0.25λ, less than 0.1λ, or smaller), the R, L, and C characteristics will be equivalent to ε and σ for that small volume. An important advantage obtained by using orthogonal wires with series lumped components is that a different ε and σ can be synthesized in each direction. When an inductance is used with a series-connected wire that couples to the electric field, the inductance produces an effective electrical permittivity that has a negative value. The interconnecting wires themselves can have an effective inductance property and/or a mutual capacitance between the wires, which can be compensated for in the design of the RRAAD or VLAAD elements.

Figure 3A:
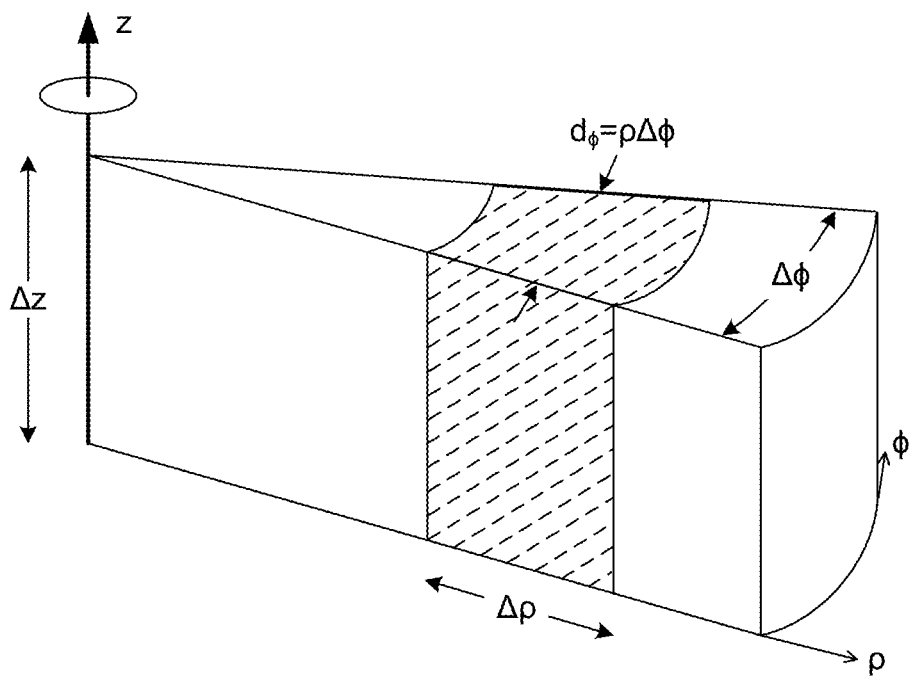
FIGS. 3A-3C illustrate examples of anisotropic constitutive parameter derivation and implementation geometries, according to various embodiments of the present disclosure.
Figure 3B:
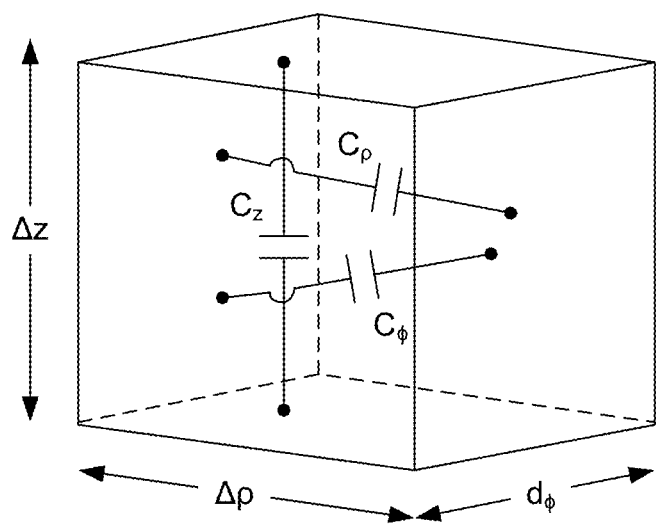

For a cylindrical structure, consider a region that is a section of the cylinder of finite height ($\Delta z$), for example a section of a wedge having an angle ($\Delta \phi$) as illustrated in FIG. 3A. Now consider the shaded volume shown in FIG. 3A as a unit cell. In the lower limit, this volume can be represented as a rectangular prism with sides of dimensions $\Delta\rho \times \Delta z \times d_\phi$, where $d_\phi = \rho\Delta\phi$. An "artificial" dielectric (AD) with anisotropic permittivity within the unit cell of FIG. 3A can be achieved by placing wires and lumped elements (e.g., capacitors) as shown in FIG. 3B. In the arrangement illustrated in FIG. 3B, capacitors are shown in each of the three directions ($C_z$, $C_\rho$, $C_\phi$).

Figure 3C:
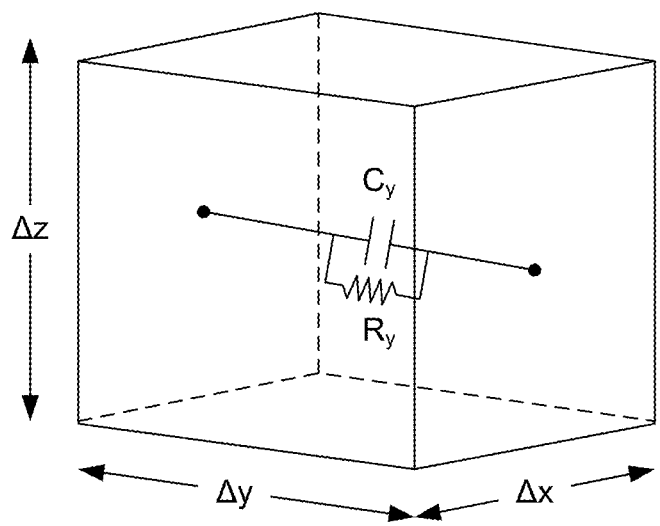

Now, consider the rectangular unit cell of FIG. 3B with dimensions $\Delta x \times \Delta y \times \Delta z$, filled with an anisotropic, homogeneous dielectric with permittivity $\vec{\varepsilon}_r$ given by $[\varepsilon_{r_x}, \varepsilon_{r_y}, \varepsilon_{r_z}]$ and conductivity $\vec{\sigma}$ given by $[\sigma_{r_x}, \sigma_{r_y}, \sigma_{r_z}]$. As illustrated in FIG. 3C, the homogeneous dielectric can be replaced by the AD by placing, e.g., a combination of wires, capacitors, and resistors in the volume as illustrated in FIG. 3C. While various combinations of capacitors and resistors can be used to provide the AD, only one set of wires with parallel resistor/capacitor ($R_y$ and $C_y$) is shown in FIG. 3C for illustration and clarity. Similar sets of wires with parallel R and C can be positioned for the other orientations (x and z) shown in FIG. 3B. The resistors and capacitors can be variable and controllable. For example, the resistor and capacitor can be switched or selectable elements to allow for adjustment of the ACP characteristics. Naturally occurring anisotropic materials or engineered anisotropic materials such as, e.g., isotropic materials arranged to produce bulk anisotropic effects, may also be used to produce the desired effects. The characteristics of a unit cell can be described as follows.

For a parallel-plate capacitor of equal plate area A and plate separation d, with a material of relative permittivity $\varepsilon_r$ between its plates, the capacitance is given by:

$$C = \frac{\varepsilon_o \varepsilon_r A}{d} \tag{7}$$

If a cube of space with sides of length a were selected to be given a synthetic permittivity, this equation would reduce to:

$$C = \varepsilon_r \varepsilon_0 a \tag{8}$$

Note that this permittivity is directional—only the E-field parallel to the wire attached to the capacitor will be influenced by this capacitance. Note that to achieve a negative permittivity at a single frequency in a given direction, an inductor can be used to achieve the reactance (with a sign opposite of the capacitive reactance).

To derive the relation for conductivity, consider a resistor of resistivity $\rho_R$, length l, and area A. The resistance of this resistor can be calculated using the equation:

$$R = \frac{\rho_R l}{A} \tag{9}$$

If the same cube of side length a is used as in the previous calculation, this equation reduces to:

$$R = \frac{\rho_R}{a} = \frac{1}{\sigma a} \tag{10}$$

Again, this conductivity (σ) will only be experienced by the field (or field component) parallel to the wire connected to the resistor.

A similar process can be followed to allow for the creation of the desired anisotropic permeability. An "artificial" permeability cell can be structured to interact with the magnetic field in the zone of interest. Interaction with the magnetic field can be achieved by loops of conductors (e.g., inductors) rather than lengths of conductors. The loops are arranged such that the area of the loop is perpendicular (or substantially perpendicular) to the magnetic field, which for the ZSW is the field $H_\phi$.

The "artificial" permeability element stores energy that is extracted from the magnetic field. This energy storage process can be achieved by arraying lumped element inductors along a closed path in the φ-direction around the launching structure. The inductors or N-turn loops of conductors having cross-sectional area $A_L$ can be positioned to form an array of closed-loop conductor elements. In some implementations, the energy storage elements can comprise lumped element capacitors that are used to complete the circuit of closed-loop conductor elements that are arrayed around the launching structure such that the areas of the loops are perpendicular (or substantially perpendicular) to $H_\phi$. The derivations of the equations for these elements are not shown here, but they can be determined by application of the process used to derive conductivity and permittivity. The resulting inductance equation to achieve the "artificial" permeability $\mu_r$ can be reduced to:

$$L = \frac{\mu_0 \mu_r N^2 A_L}{d} \tag{11}$$

The value of a lumped element capacitor $C_L$ that can complete the circuit of an $N_L$-turn loop used to create an effective inductance element is given as:

$$C_L = \frac{Ad\mu_r}{\omega^2 A_L^2 N_t^2 \mu_0} \quad (12)$$

The unit cell area A and spacing d are the same as the values selected for the ACP elements described above with respect to equations (7)-(10). Other cell areas and spacings are possible and will yield different values for the lumped element components. As for the case of the ACP cells, if the cell is a cube of space with sides of length a, then $C_L$ becomes:

$$C_L = \frac{a^3 \mu_r}{\omega^2 A_L^2 N_t^2 \mu_0} \quad (13)$$

Negative values can be achieved by selecting operation above or below a resonance condition for the lumped element type being considered.

The relationships for μ, ε, and σ based on series R, L, and C values presented above assume a rectangular coordinate scheme and further simplify the process by making the discretization volume (or unit cell) a cube. Other rectangular discretization volumes can be used, with the derivations for R, L, and C updated accordingly. When the unit cell is chosen to be a cube, the HAAMP elements within that cell will consist of two orthogonal loops in the x and y directions. Since the ZSW has only an $H_\phi$ component, the magnetic field will interact with the two loops according to the desired effect. The same process used to calculate R, L, and C for rectangular coordinates can be applied in other coordinate systems as desired.

Now consider a launching structure having primarily a vertical current (e.g., a stub antenna, loaded monopole or other appropriate high current probe structure or transducer) that can deliver energy to the incident wave. In the zone of transition from the launching structure to the uncontrolled traveling zone of the ZSW along the boundary, the energy delivered by an energy source to the launching structure includes a locally stored portion, a circuit element loss portion, and a moving portion. The circuit element loss portion comprises all of the energy that is converted to heat in the various launch probe components and the heat that is generated in the ρ-directed polarizable elements. The moving portion is that energy that includes a small fraction that is lost as heat in the earth and a large fraction that propagates along the surface according to the properties of the ZSW.

Figure 4:
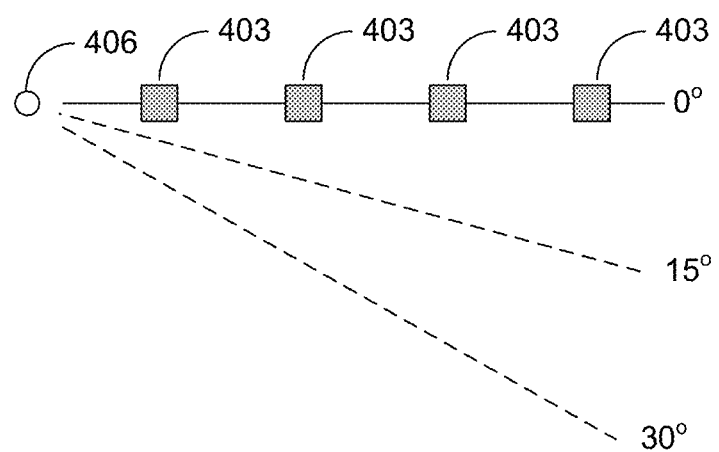
FIG. 4 illustrates a radial arrangement of anisotropic constitutive parameter (ACP) elements depicting a cylindrical coordinate system description of the of dispersed array elements, according to various embodiments of the present disclosure.

As illustrated in FIG. 4, the most practical arrangement of the ρ-directed ACP elements 403 is to align them radially extending outward from the current structure (launching structure) 406 and to displace them at uniform angles in the direction according to a cylindrical coordinate system having its origin at the vertical center of the launching structure. Under this cylindrical arrangement, the polarization properties of the individual ACP elements 403 increase in value with increasing radial distance such that the average ρ-directed polarization per unit volume remains constant. In other implementations, the side length in the φ direction can shorten as the radius increases. In this case, the ACP system can be arranged in cylindrical shells with each shell having more segments in the direction as the radius increases.

The polarization properties with increasing radial distance can be increased in various ways. For example, if the radial spacing between the lumped element energy storage capacitors of ACP elements 403 comprising RRAAD elements is kept constant (e.g., less than 1/10 of the wavelength) as depicted in FIG. 4, then the size of the capacitors can be increased in proportion to distance from the current structure (launching structure) 406. In other implementations, if the capacitor values are held constant, then the spacing between the capacitors can be increased with increasing radius from the probe. The modifications to achieve the energy loss conductance exhibits the same behavior. Note that lumped element resistors used for the polarizable elements are utilized according to their reciprocal property of conductance since they are being used to match the conductivity property of the material in region 1 (e.g., the earth).

The ρ-directed ACP elements 403 can also be stacked in the vertical direction (z) such that the wave impedance for the vertically propagating components of the ZSW extends to a height above the interface. Layers of ACP elements (e.g., RRAAD elements) 403 can be vertically stacked to a height that is sufficient to assure good coupling from the launching structure along its vertical extent.

Different launching structure configurations can be utilized for coupling propagating waves into the ZSW mode. The vertical extent of the ρ-directed ACP elements can be adjusted to match the size and shape and launch characteristics of each launching structure. The radial extent of the arrangement of the ρ-directed ACP elements will also depend upon the size and shape and launch characteristics of the launching structure. The overall size of the array of ACP elements will be governed by the tradeoff between capturing as much of the energy coupled from the launching structure as possible versus size limitations of the array such as, e.g., fitting to the available space around the launching structure and/or maintaining the cost of the array within prescribed limits.

Figure 5:
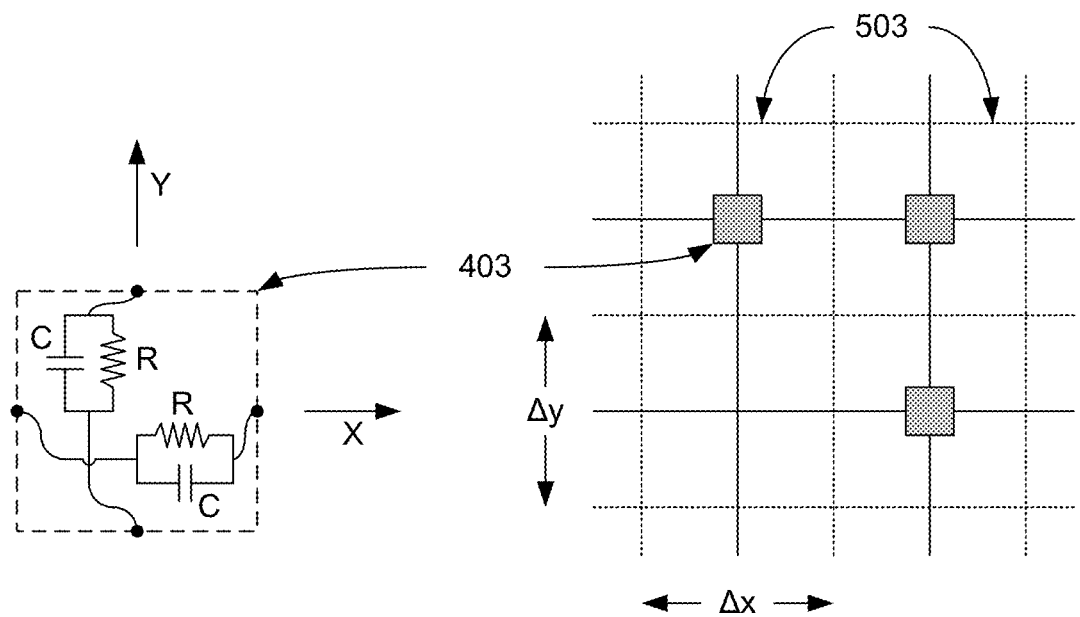
FIG. 5 illustrates a rectangular coordinate arrangement of ACP elements comprising radial resistive artificial anisotropic dielectric (RRAAD) elements, according to various embodiments of the present disclosure.

Since the ZSW has no φ-directed component of electric field, it is possible to use a rectangular array of ACP elements (e.g., RRAAD elements) to create the desired anisotropic permittivity characteristic such that the projected impedance component in region 2 (e.g., the air) matches that of region 1 (e.g., the earth). An x-y grid of RRAAD elements can obtain the same effect with respect to the $E_\rho$ component of electric field as a radially directed array, and the RRAAD elements themselves do not need to change with distance from the launching structure. FIG. 5 illustrates an example of a network topology having an array of ACP elements 403 comprising RRAAD elements distributed in a grid pattern in the x-y plane. All of the lumped component values can be equal for the grid implementation. The disadvantage of the x-y grid is that more energy-storage and energy-loss lumped element components will be used.

Figure 6A:
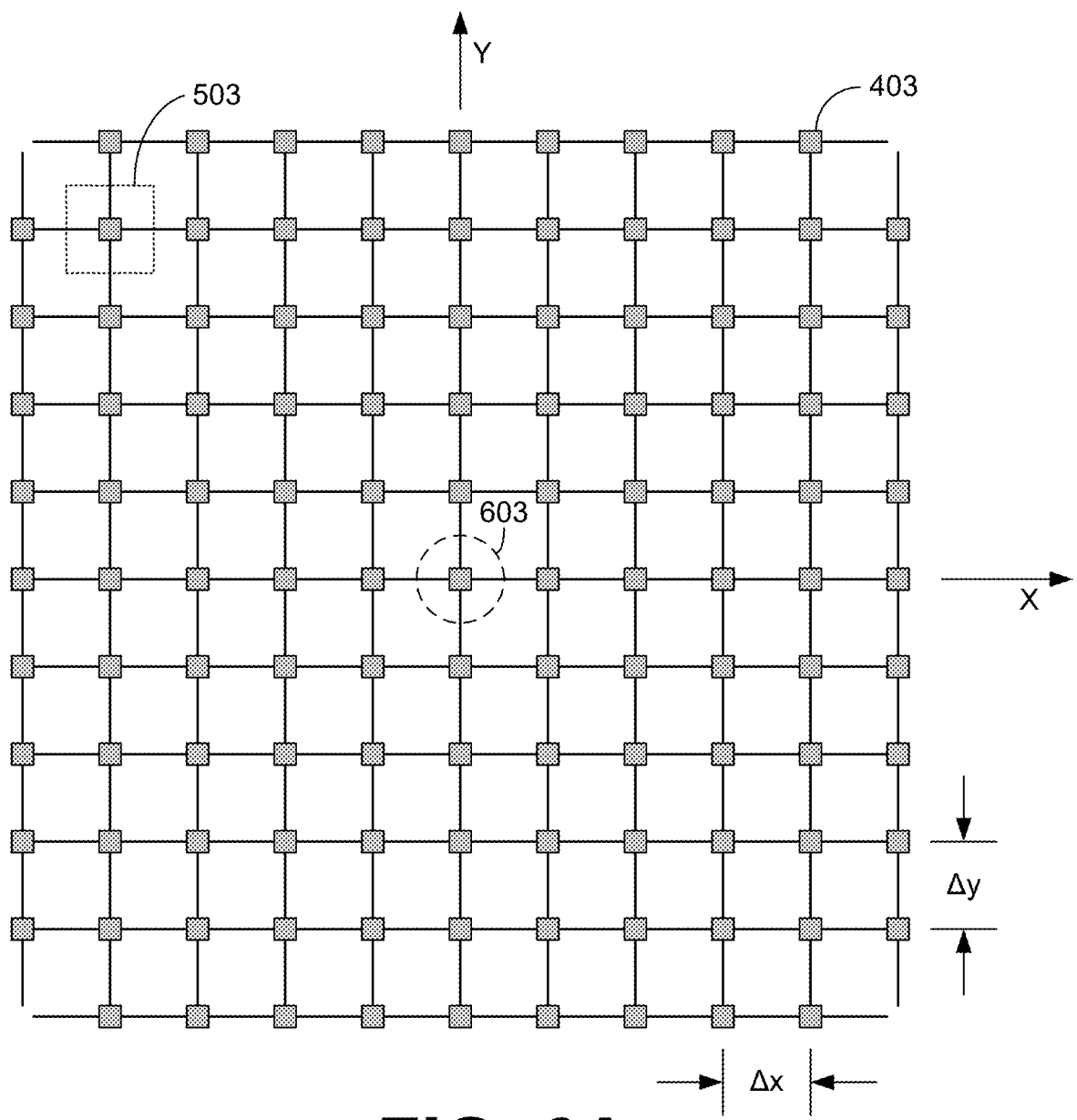
FIGS. 6A-6B illustrate alternative x-y grid arrangements of ACP elements for the case of an odd and an even number of rows and columns of elements, respectively, according to various embodiments of the present disclosure.

As can be seen in FIG. 5, each unit cell 503 of the array includes RRAAD elements (resistor and capacitor) in the x and y directions that are not electrically connected, which provide independent polarizations. The dual polarization of this combination of elements can affect $E_x$ and $E_y$ equally, such that the x and y oriented RRAAD elements are equivalent to a radial RRAAD element. The dual-polarized RRAAD elements can be distributed in one or more layers to provide an array of horizontally oriented ACP elements 403. FIG. 6A shows an example of a single layer of an 11×11 grid of wires with dual-polarized RRAAD elements located at the x-y cross-over points. The spacing of the cells in the array can be based upon a fraction of a wavelength ($\lambda_0$) at an excitation frequency. For example, the spacing dimensions of the array can be $\Delta x = \Delta y = \lambda_0/10$, or the separation between RRAAD elements can be $\leq \lambda_0/10$. In the example of FIG. 6A, the array provides an electrically rectangular ACP layer of ACP elements 403 with an overall dimension of $\lambda_0 \times \lambda_0$. The central RRAAD element (circled) and the four connecting wires can be removed from the center 603 of the array and replaced with a launching structure to provide ACP matching in all directions about the launching structure. The array of FIG. 6A can be similarly distributed about a receiving structure. The RRAAD elements along the perimeter of the array affect only one polarization (field direction) based upon the x and y orientation of the connecting wires. Since the corner RRAAD elements are connected to only one wire in each direction, they can be removed as shown.

Figure 6B:
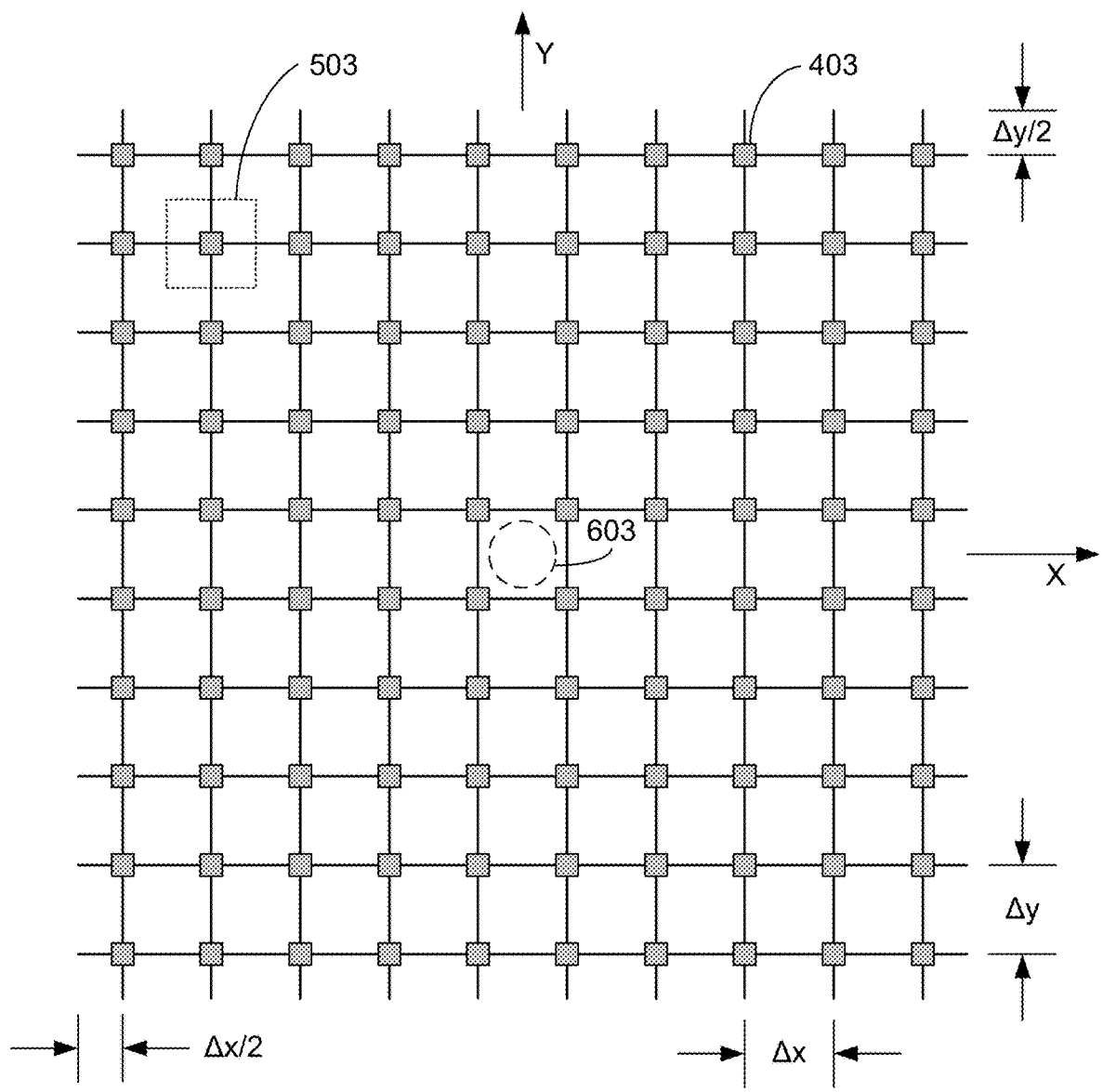

FIG. 6B shows another example of a single layer of a 10×10 grid of wires with dual-polarized RRAAD elements located at the x-y cross-over points. The spacing of the unit cells 503 in the array can be based upon a fraction of a wavelength ($\lambda_0$) of an excitation frequency. For example, the spacing dimensions of the array can be $\Delta x = \Delta y = \lambda_0/10$, or the separation between RRAAD elements can be $\lambda_0/10$. Half-length wires (e.g., $\Delta x/2 = \Delta y/2 = \lambda_0/20$) extend from each of the outermost dual-polarized RRAAD elements. As in FIG. 6A, the array configuration of FIG. 6B provides an electrically rectangular ACP layer of ACP elements 403 with an overall dimension of $\lambda_0 \times \lambda_0$, but reduces the number of RRAAD elements to 100. A launching structure can be positioned in the center 603 (circled) of the array to provide ACP matching in all directions about the launching structure. The array of FIG. 6B can be similarly distributed about a receiving structure.

A plurality of the ACP layers 606 comprising ACP elements 403 such as the examples in FIGS. 6A and 6B can be vertically stacked to form the ACP as illustrated in FIG. 6C. Spacing between the layers 606 ($\Delta z$) can be based upon a fraction of a wavelength ($\lambda_0$) of an excitation frequency. The spacing can be uniform with the bottom layer positioned above (or within an effective proximity to) the surface of the earth by $\Delta z/2$. For example, the spacing between the ACP layers 606 can be the same or a fraction of the spacing dimensions of the array ($\Delta x$, $\Delta y$). For instance, the vertical spacing can be $\Delta z = \Delta x/4 = \Delta y/4 = \lambda_0/40$. The vertical spacing may also be determined in terms of a grid wavelength ($\lambda_G$) based upon the permittivity of region 1 ($\varepsilon_{r,1}$). For example, $\Delta z = \lambda_G/10$ where $\lambda_G = \lambda_0/4$ for $\varepsilon_{r,earth} = 16$. Other vertical spacings ($\Delta z$) can also be used.

The wave impedance in the $\rho$ direction will be largely unaffected by the $\rho$-directed RRAAD elements that are used to modify the z-directed wave impedance. The wave impedance in the $\rho$ direction does not need an energy loss characteristic for the effective launch of a ZSW. In the simplest situation, no ACP elements need to be arranged in the vertical direction (z) and the wave impedance can be controlled by the electrical properties of region 2 (e.g., the air).

Vertical ACP elements. In some implementations, for example when the operating frequency is decreased, it can be desirable to introduce purely energy storage elements such as, for example, lumped element capacitors connected in a series arrangement via low loss conductors to form vertically disposed or z-directed VLAAD elements that act to lower the wave impedance in the $\rho$ direction and thereby increase the value of the radially directed propagation constant in the immediate vicinity of the launching structure. The increase in the radially directed propagation constant can cause the wavelength of the ZSW to decrease and thereby reduce the radial extent used for deployment of the $\rho$-directed RRAAD elements.

By increasing the radially directed propagation constant, the launching structure becomes a phase velocity reducing (or slow wave) structure in the radial direction. Consequently, the propagation constant in region 2 (e.g., the air) in the vertical (normal) direction above the radially extended ACP structure becomes a purely real number, which forces the wave to be evanescent in the z direction. In other words, radiation from the current structure (launching structure) in the vertical direction is eliminated. The nature of the field components in the zone above the current structure are quite similar to (or match) the field characteristics of a pure Zenneck wave as it propagates along the surface of region 1 (e.g., the earth). Having field characteristics with high similarity is an important factor in mode matching of the launching structure energy to the desired ZSW.

Deploying z-directed VLAAD elements allows the wave impedance in the $\rho$ direction inside the cylindrical zone to be matched to the wave impedance in region 2 (e.g., the air) by properly choosing the radius of the ACP cylinder. As noted above, the wave impedance in the $\rho$ direction changes with the value of $\rho$ according to the properties of the Hankel functions that describe the E and H fields in the wave. Whereas the z-directed VLAAD elements produce a compression of the Hankel function behavior in the $\rho$ direction such that the asymptotic impedance value is achieved over a shorter physical distance, the impedance for small values of $\rho$ will still be very close to the impedance in region 2 (e.g., the air) and may not use an impedance matching element.

The asymptotic impedance value (e.g., the large argument asymptote), however, can be lower than that of free space and thus matching for larger values of $\rho$ may be appropriate. For example, a second radial segment of z-directed ACP elements having an impedance value that is the geometric mean of the inner segment and air can be used for matching and to make the radial extent equal to one quarter wavelength.

Horizontal artificial anisotropic magnetic permeability (HAAMP) elements. Another method for impedance matching and for creating a slow wave zone around the launch probe is to use HAAMP elements in the $\phi$ direction such that the inductive elements interact with $H_\phi$ to increase the effective magnetic permeability presented to the ZSW. The overall impact of the HAAMP inductive elements is a decrease in the phase velocity of the wave in the same manner as the VLAAD elements, but simultaneously increasing the $\rho$-directed impedance. With appropriate selection of the permeability value using the inductive elements and the permittivity using the VLAAD elements, the impedance can be substantially matched to the free space value even while achieving an enhanced slow wave behavior.

Figure 7:
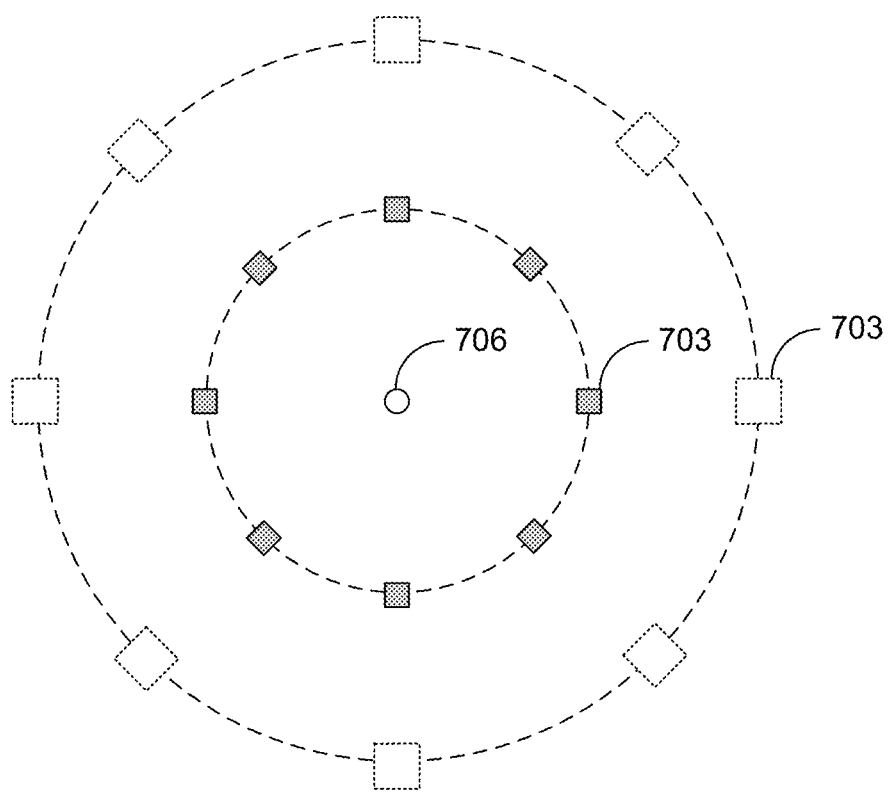
FIG. 7 illustrates a two-dimensional cylindrical coordinate arrangement of ACP elements, such as HAAMP elements, according to various embodiments of the present disclosure.

As previously discussed, HAAMP elements can be positioned or arrayed about a launching structure to modify the propagation constant in the $\rho$ direction and to match the $\rho$-directed impedance to the intrinsic impedance of region 2 (e.g., the air). FIG. 7 illustrates an example of HAAMP elements 703 distributed about a launching structure 706 and aligned with the horizontal $\phi$-directed magnetic field. The array of HAAMP elements 703 can include groups of HAAMP elements 703 positioned at one or more radial distances from the launching structure 706. The HAAMP elements 703 can comprise loops of conductors (e.g., lumped element inductors) connected to form closed-loop conductor elements. The loops of conductors (or inductors) can include taps that can be switched between to control or adjust the effective permeability presented by the HAAMP array. In some implementations, the loops of conductors (or inductors) can be coupled to capacitors, which can be varied or switched to provide the adjustment or modification. While the HAAMP elements 703 are shown distributed as a cylindrical system, they can also be implemented in a rectangular system with independently controlled x and y oriented HAAMP elements similar to the RRAAD system.

An ACP system was implemented using a stacked array of RRAAD elements as illustrated in FIGS. 6A and 6C for verification at a frequency of 50 MHz. The RRAAD elements were arranged in a stacked array including 5-layers of RRAAD elements distributed about a launching structure as shown in FIG. 6A. The RRAAD elements include an interconnected printed circuit board (PCB) with the R and C lumped elements for the x and y orientations disposed on opposite sides of the PCB. While the polarized elements for the x and y orientations can reside on the same PCB, the polarized elements are not electrically connected. Wires were connected between adjacent PCBs in that layer to form the rectangular grid.

Each RRAAD circuit module included a control board and an impedance board with two independently controllable circuits made up of lumped resistor and capacitor elements connected in parallel. The selectable ranges of the resistor and capacitor values were chosen to give an "artificial" conductivity from about 8 mS/m to 165 mS/m in 128 (7 bits) steps and an "artificial" relative permittivity ranging from 4 to 45 in 8 (3 bits) steps. For this experiment, the sigma index values were constrained to the 0 to 110 range, giving a range in sigma from about 8 to 63.2 mS/m. The indices and parameter values for sigma are nonlinear because resistors are being used to create the conductivity values. The conductivity steps are thus inversely related to resistive steps.

The RRAAD modules were interconnected in a rectangular grid using solid 16-gauge insulated tinned copper wire approximately 20 inches in length. A rectangular grid arrangement was selected rather than a cylindrical deployment to simplify circuit design and control. For a cylindrical deployment either the component values or the spacing are varied as a function of distance from the launching structure. Control inputs were communicated to the boards via the power connections lines that have RF inductive chokes to isolate the DC and low frequency control signals from the 50 MHz wave energy. The modules were controlled via a program that ran on a PC laptop.

Figure 8A:
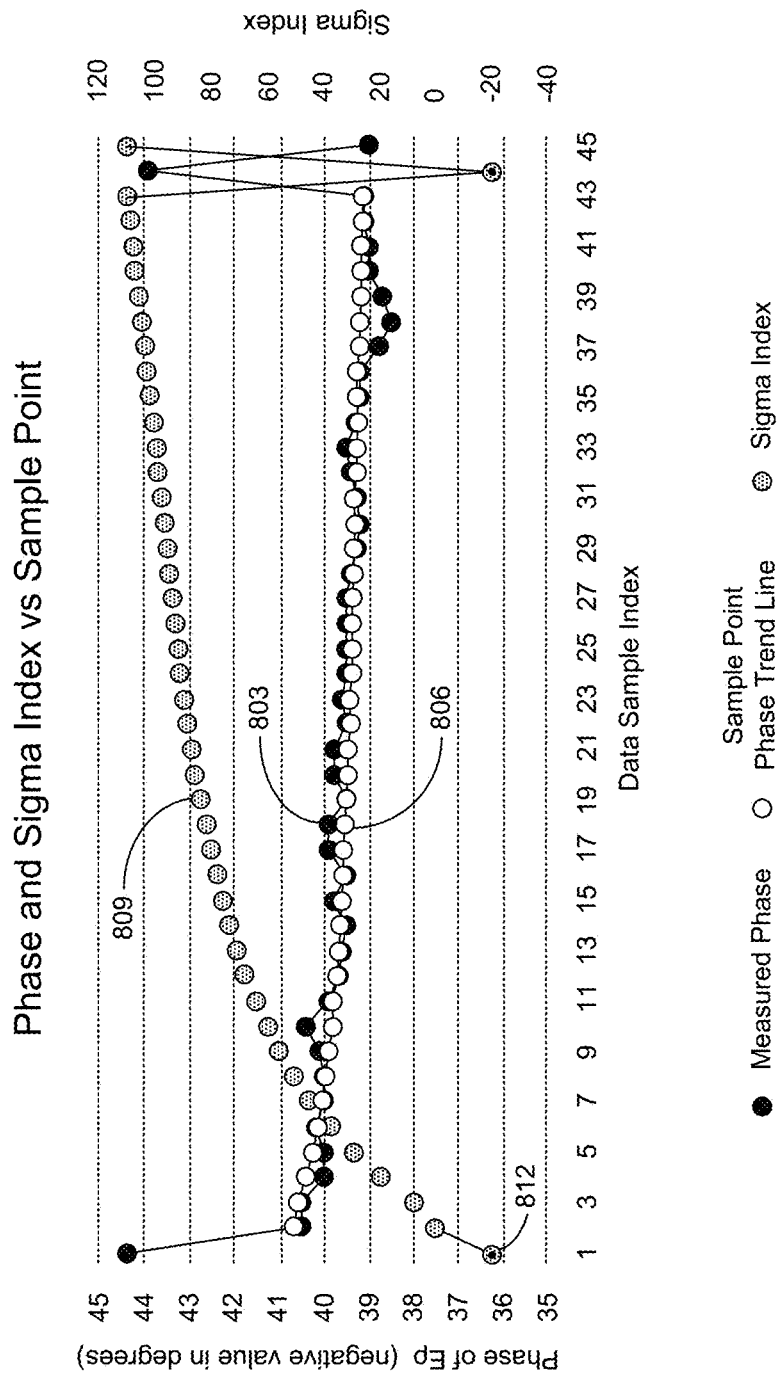
FIGS. 8A and 8B are plots of phase and amplitude measurements of surface waves versus conductivity selection setting (Sigma index) illustrating the effects of varying the resistive values of the RRAAD elements, according to various embodiments of the present disclosure.

Testing was carried out with an excitation of 50 MHz and data was collected over several hours. FIG. 8A is a plot illustrating an example of measured phase angle 803 between $E_\rho$ and $H_\phi$ with respect to the sample point phase trend line 806. The collected data confirmed that the RRAAD elements do impact the impedance and phase of the $E_\rho$ component. The sigma index value 809 is the binary code sent to the ACP element control board to select the resistance value that adjusts the effective conductivity of the RRAAD elements in the array. The lowest conductivity is to the left on the chart. The permittivity value used for these plots was for a single set point that was set to approximate a relative permittivity value of 15. The first data point 812 represents the case wherein the ACP board is disabled. A value of −20 was used as the sigma index value 812 to indicate the disabled state. In the disabled mode, the resistive and capacitive elements are disconnected from the interlinking wires. For example, a connection to the R and C elements can be broken (or opened) or the elements can be electrically isolated. In some implementations, the R and C elements can be shorted.

Figure 8B:
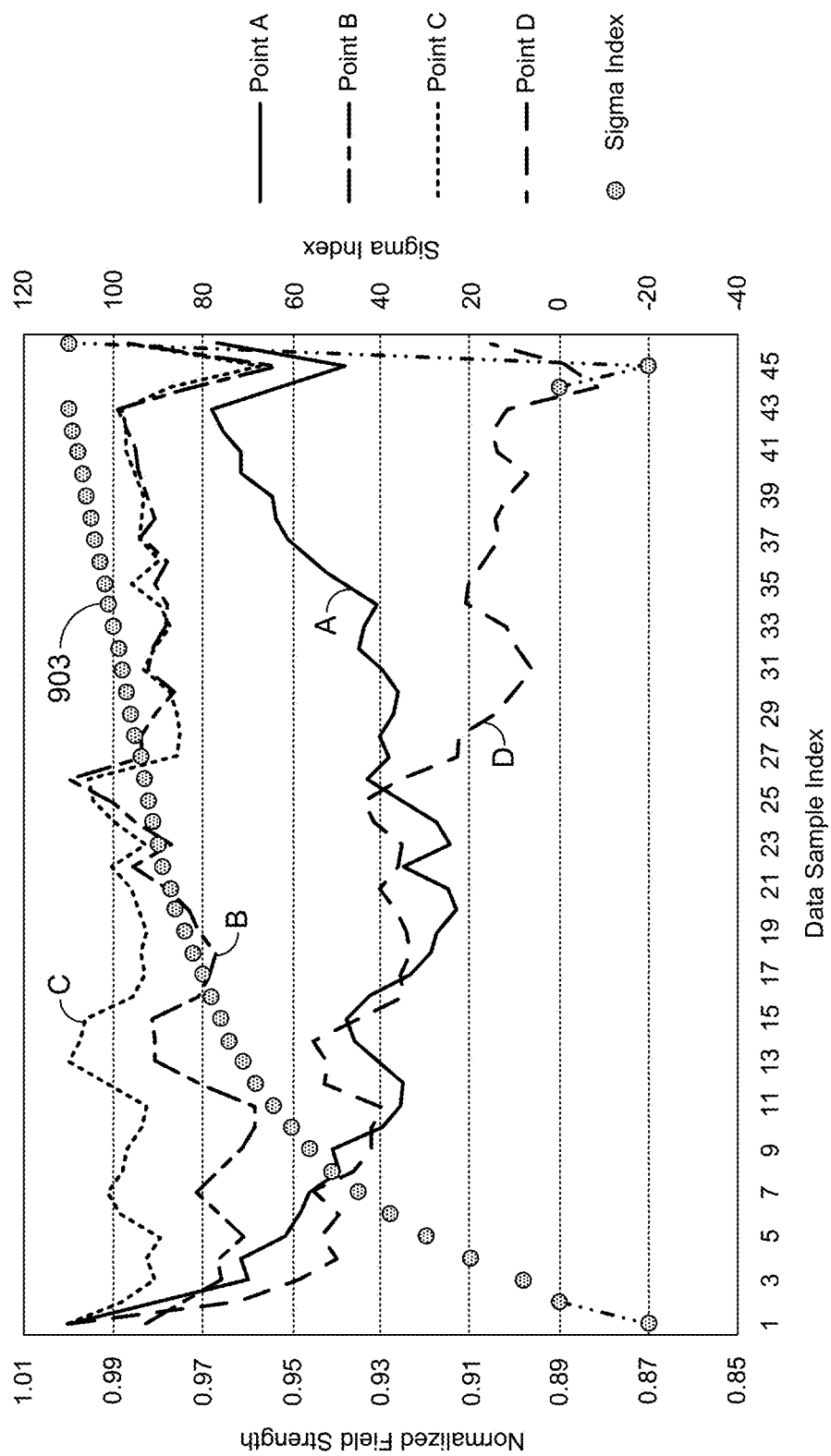

FIG. 8B shows a graph illustrating an example of the normalized field strength readings collected by the FIMR (field intensity measurement/remote) array that was deployed from the ACP test zone out to about 0.9 miles. The plots shown in FIG. 8B are for four deployment locations (Points A-D). The data clearly illustrates a correlation in the general character of the plots (A-D) that indicates a common responsiveness to the changes in the "artificial" conductivity variations. The line segments at the beginning and end of the sigma index points 903 identify the points for which the RRAAD elements were disabled. The first FIMR data point is seen to differ from the repeated "disabled" set point at the end of the experiment. This may be attributed to the data at the first point not corresponding to the assumed system state.

At one phase measurement point, which was approximately one wavelength from the launching structure, a loop antenna was used to sample the $H_\phi$ component of the wave and a rotatable biconical dipole to couple to the radial and vertical components of the electric field. A vector voltmeter (VVM) was used to measure the relative magnitudes and phases of $E_z$ and $E_\rho$ the electric fields with respect to $H_\phi$. The connections from the antennas to the VVM were done with phase matched cables that were arranged in an approximate circular arc along the ground centered about the launching structure, so as to minimize the induction of currents into the coaxial cables. The circular arrangement minimized coupling to the electric fields since $E_\phi$ is zero.

With this arrangement it was possible to measure the vertically projected (z-directed) impedance of the wave, $\eta_s$, and the wave tilt angle, including the phase difference between $E_z$ and $E_\rho$. Recall that the value of the wave tilt angle in the air (or region 2) is equal to the real part of the complex Brewster's angle in the earth (or region 1) for the ZSW.

At 50 MHz, for σ of 15 mS/m and $\varepsilon_r$ of 15, the wave tilt angle should be about 13.882 degrees and the phase difference between $E_z$ and $E_\rho$ calculates to be about 9.887 degrees. The vertically projected impedance for this wave tilt was computed to be about 90.475+j14.836 ohms.

Since the phase measurement point was about one wavelength from the launching structure, the ρ-projected impedance of the wave at about 6 meters for the given $\varepsilon_r$ and σ can be determined to be about 362.476+j25.688 for a pure ZSW. If the phase measurement point were moved out to about five wavelengths (or 30 m), the ρ-projected wave impedance would be about equal to $\eta_0$ and $E_z$ would be almost in phase with $H_\phi$. The magnitude of $E_\rho$ to the measured $E_z$ at the one wavelength point may be scaled to get a rough estimate of the magnitude of the vertically projected impedance and the phase measurement between $E_z$ and $E_\rho$ used to resolve it into its resistive and inductive components. A phase angle between $E_z$ and $H_\phi$ was measured to be about 13 degrees.

The estimated value of the ρ-projected impedance, $\eta_\rho$, that is computed for the launching structure arrangement, based upon the measured phase difference between $E_z$ and $H_\phi$, was found to be about 361+j80 ohms. The vertically projected impedance, $\eta_s$, can be found by taking the ratio of the magnitude values for $E_z$ and $E_\rho$ and scaling the impedance values accordingly. The scale factor between the two electric fields was determined to be about 6.8. The wave tilt angle based upon magnitudes is the arc tangent of 1/6.8 or approximately 8.3 degrees. The measured phase angle between the electric fields was about 27 degrees (40−13). For these data, the vertically directed impedance was estimated to be about 48+j24 ohms. Clearly, the data show a difference from the surface impedance values that were estimated for a ZSW launch for the selected soil parameters, and the resulting radial data confirm that fact.

The measurements allow for a good estimate of the wave tilt. Since it is relatively simple to measure the phase and amplitude of the electric field components with respect to the φ-directed magnetic field, the scale factor and phase difference between $E_z$ and $E_\rho$ are readily determined. The measured wave tilt of 8.3 degrees versus the predicted 13.882 value would seem to indicate that the soil properties were quite a bit different from the selected values. Note also that the wave tilt property varies with distance from the launch probe, as does the wave impedance. Even with these variations, the initial test results are quite encouraging.

Normally, one computes the power delivered from a transmitter to a receiver according to the Friis transmission equation. Using the Friis equation, the power density is assumed to fall off at $1/4\pi r^2$ from an assumed isotropic radiating point source. For a cylindrical surface wave, an isotropic vertical line can be assumed to be the launch source and express the power density in watts/meter, rather than watts/m², as is done for radiation. By assuming an infinite line source, it is possible to only consider the effective width of the receiver as the gain function for the receiving probe.

Following the analogy with spherical waves, the effective width of the receiving element would be the receiving element gain $G_r$ times $\lambda/2\pi$. In more formal notation the equation for the power received would be $$P_r = \frac{P_T G_t G_r \lambda}{4\pi^2 R} \quad (14)$$

where $P_r$ is the power received, $P_T$ is the power transmitted by the launching probe structure, $G_t$ is the launch probe gain, $G_r$ is the gain of the receiving structure, $\lambda$ is the wavelength that is approximately c/f, and R is the distance from launch probe to receiver. For the Henkel function, the exact wavelength varies as a function of distance, but c/f will give a good estimate for our purposes.

One can compare equation (14) with the Friis transmission equation, which is $$P_r = \frac{P_T G_t G_r \lambda^2}{(4\pi R)^2}. \quad (15)$$

The gains for a cylindrical wave launch probe and a cylindrical wave receiver are calculated differently from that of an antenna. The ZSW is such a cylindrical wave and, if there is no focusing of the wave in the φ direction, then the gain of the launch probe or receiver is equal to unity. The value of the transmitted power would be found by correcting the available signal source power $P_s$ by mismatch reflection and resistive losses. One can also include a loss factor term in equation (14) to account for attenuation of the ZSW when the σ and ε values are known.

Receiving Structures. For power transfer applications, the receiving structure can be efficiently coupled to the ZSW mode so that the maximum power can be extracted from the cylindrically propagating wave. An ACP structure provides improvements in coupling efficiency by increasing the effective electrical dimensions of the physical receiving structure. When the traveling ZSW or, in the case of a global ZSW, a standing wave interacts with the receiver ACP polarizable elements, the wavelength of the energy is reduced and the propagation constant above the polarizable elements is altered in a manner analogous to the launching probe structure. Above the receiving structure, the wave in region 2 (e.g., the air) will be evanescent in character and the energy in the wave will be concentrated in the ACP zone.

It is very beneficial for the receiving structure for a global standing wave (or for any standing surface wave) to have reciprocal properties to that of the launching structure so that any reflections from the receiving structure are themselves ZSWs. If such is not the case, then the reflected energy will be lost to radiation.

FIGS. 9A and 9B illustrate examples of power density simulation results for a simple receiving structure that employs a monopole antenna according to a conventional receiver versus a receiving structure that employs ACP elements to concentrate the available electromagnetic power around a receiving structure. While the simulation can produce gradations of fine resolution, the representations provided in FIGS. 9A and 9B have been simplified to show a limited number of gradations for clarity and reproducibility. As seen in FIG. 9A, a radiating source of electromagnetic energy (or launching structure) 1103 is modeled on the left side creating a wave that travels to the right. A conventional monopole receiver 1106 is placed at a distance of three wavelengths. The receiver (or receiving structure) 1106 couples to the traveling wave to extract energy from the wave. The traveling energy is seen to appear about the receiving structure and continuing to its right.

In FIG. 9B, ACP elements comprising VLAAD and HAAMP elements are placed around the receiving structure 1106, creating a slow wave zone. The effective $\varepsilon_r$ and $\mu_r$ created by the ACP system of VLAAD and HAAMP elements are set to equal values. In this simple example they are set to a value of ten, so that the impedance seen by the traveling wave is equal to that of free space whereas the phase velocity is reduced by a factor of ten. As can be seen in FIG. 9B, the field strength is concentrated in the zone around the receiving structure 1106 and that the fields above and to the right of the receiving structure 1106 are greatly attenuated indicating that energy has been extracted from the wave.

As noted above, any of the elements of the ACP system can be individually controlled according to the conditions of a particular installation. This allows the ACP system to have a dynamic behavior or nonhomogeneous distribution of interfering structures or other characteristics of the surrounding media in or near the launch or receiving zone. The control of the elements can be accomplished as part of an automated feedback network wherein measurements of the desired wave properties can be measured at selected points and such measurements used to adjust the ACP elements to give a desired performance result for whatever conditions may be encountered. It will be recognized by those skilled in the art that for some conditions, the anisotropic control adjustments can include conditions for which the constituents assume equal values in the various directions without deviating from the features of the present invention.

Whenever VLAAD and HAAMP elements are used to increase the permittivity and permeability in the radial direction, they create a slow-wave propagation region for energy traveling in the ρ direction. In the region above the ACP elements, the propagation constant in the radial (ρ) direction must match that of the ACP slow-wave propagation constant. This boundary condition further requires that the propagation constant in the vertical direction (z) become a purely real number, corresponding to the creation of an evanescent characteristic in the z direction. The fields above the ACP elements propagate in the radial direction, but only attenuate with no change in phase in z. Since there is no upper limit to the zone above the ACP elements (e.g., VLAAD and HAAMP elements), the effect is to create a slowly propagating cylindrical wave that has the property of approximating an infinite vertical source element. Many theoretical studies, such as "Excitation of the Zenneck Surface Wave by a Vertical Aperture" by Hill and Wait (*Radio Science*, Volume 13, Number 6, pages 969-977, November-December 1978), which is hereby incorporated by reference in its entirety, have identified the conditions needed to create a ZSW. The present disclosure presents a source structure (launching structure) that can satisfy these theoretical studies.

Aspects of the present disclosure are related to ACP elements to form an ACP system that can be used to launch or receive Zenneck surface waves, or other types of surface waves. In one aspect, among others, an ACP system, comprises an array of ACP elements distributed above (or within an effective proximity to) a boundary medium (e.g., a lossy dielectric, terrestrial medium or earth). The array of ACP elements can comprise a first plurality of RRAAD elements positioned above (or within an effective proximity to) the boundary medium, with the first plurality of RRAAD elements comprising one or more series of interconnected RRAAD elements extending in a first orientation, wherein the first plurality of the RRAAD elements forms a horizontal layer at a height above (or a distance from) the boundary medium. The array of ACP elements can be a cylindrical array with each of the one or more series of interconnected RRAAD elements linearly oriented in a $\rho$-direction. In one or more aspects, the array of ACP elements can comprise a second horizontal layer of RRAAD elements positioned above (or a distance from), and substantially parallel to, the horizontal layer of RRAAD elements distributed at the height above (or within an effective proximity to) the boundary medium (e.g., the lossy dielectric, terrestrial medium or earth). The second horizontal layer of RRAAD elements can comprise a second plurality of RRAAD elements positioned above (or a distance from) the first plurality of RRAAD elements in the horizontal layer, the second plurality of RRAAD elements comprising one or more series of interconnected RRAAD elements extending in the first orientation.

In various aspects, the array of ACP elements can comprise a second plurality of RRAAD elements positioned above (or within an effective proximity to) the boundary medium, the second plurality of RRAAD elements comprising one or more series of interconnected RRAAD elements extending in a second orientation with respect to the first orientation. The first plurality of the RRAAD elements and the second plurality of the RRAAD elements can form the horizontal layer at the height above (or a distance from) the boundary medium. Individual RRAAD element series of the one or more series of interconnected RRAAD elements of the first plurality of RRAAD elements can comprise a plurality of RRAAD elements coupled in series by wires extending in the first orientation, and/or individual RRAAD element series of the one or more series of interconnected RRAAD elements of the second plurality of RRAAD elements can comprise a plurality of RRAAD elements coupled in series by wires extending in the second orientation. RRAAD elements of the one or more series of interconnected RRAAD elements of the first plurality of RRAAD elements and the one or more series of interconnected RRAAD elements of the second plurality of RRAAD elements can be separated from adjacent elements in that series by a defined distance. The defined distance can be a fraction of a wavelength ($\lambda_o$) of an electromagnetic excitation applied to the ACP system. The defined distance can be less than or equal to $\lambda_o/10$. An overall dimension of the rectangular array of RRAAD elements can be $\lambda_o \times \lambda_o$. The height of the horizontal layer above (or the distance from) the boundary medium can be a fraction of the wavelength ($\lambda_o$).

In some aspects, the array of ACP elements can be a rectangular array with the one or more series of interconnected RRAAD elements of the first plurality of RRAAD elements linearly oriented in an x-direction and the one or more series of interconnected RRAAD elements of the second plurality of RRAAD elements linearly oriented in a y-direction substantially perpendicular to the x-direction. The rectangular array of RRAAD elements may not include RRAAD elements at corners of the rectangular array. Individual RRAAD elements of the first plurality of RRAAD elements can be collocated with a corresponding individual RRAAD element of the second plurality of RRAAD elements. The individual RRAAD element of the first plurality of RRAAD elements and the corresponding individual RRAAD element of the second plurality of RRAAD elements can be implemented on a common substrate. The individual RRAAD element of the first plurality of RRAAD elements can comprise a first capacitor and a first resistor mounted on a first side of a printed circuit board (PCB) and the corresponding individual RRAAD element of the second plurality of RRAAD elements can comprise a second capacitor and a second resistor mounted on the first side or a second side of the PCB.

In one or more aspects, the array of ACP elements can comprise a second horizontal layer of RRAAD elements positioned above (or within an effective proximity to), and substantially parallel to, the horizontal layer of RRAAD elements distributed at the height above (or a distance from) the boundary medium (e.g., a lossy dielectric, terrestrial medium or earth). The second horizontal layer of RRAAD elements can comprise a third plurality of RRAAD elements positioned above (or a distance from) the first plurality of RRAAD elements in the horizontal layer, the third plurality of RRAAD elements comprising one or more series of interconnected RRAAD elements extending in the first orientation; and a fourth plurality of RRAAD elements positioned above (or a distance from) the second plurality of RRAAD elements in the horizontal layer, the fourth plurality of RRAAD elements comprising one or more series of interconnected RRAAD elements extending in the second orientation. Each RRAAD element series of the one or more series of interconnected RRAAD elements of the third plurality of RRAAD elements can be substantially aligned with a corresponding RRAAD element series of the one or more series of interconnected RRAAD elements of the first plurality of RRAAD elements, and each RRAAD element series of the one or more series of interconnected RRAAD elements of the fourth plurality of RRAAD elements can be substantially aligned with a corresponding RRAAD element series of the one or more series of interconnected RRAAD elements of the second plurality of RRAAD elements. The second horizontal layer of RRAAD elements can be separated from the horizontal layer of RRAAD elements by a fraction of a wavelength ($\lambda_o$) of an electromagnetic excitation applied to the ACP system. The separation between the second horizontal layer of RRAAD elements and the horizontal layer or RRAAD elements can be about twice the height of the horizontal layer of RRAAD elements.

In various aspects, the array of ACP elements can be distributed about a launching structure configured to excite the ACP system with an electromagnetic field at a frequency ($f_o$). The array of ACP elements can be distributed about one side of the launching structure. Individual RRAAD elements of the array of ACP elements can comprise a capacitor and a resistor connected in parallel, the capacitor and resistor comprising one or more lumped element components. The capacitor can comprise a variable capacitance, the resistor comprises a variable resistance, or both. The array of ACP elements can comprise a plurality of vertical lossless artificial anisotropic dielectric (VLAAD) elements distributed above (or within an effective proximity to) the boundary medium (e.g., a lossy dielectric, terrestrial medium or earth), the plurality of VLAAD elements positioned above (or a distance from) the boundary medium, the plurality of VLAAD elements comprising one or more series of interconnected VLAAD elements extending in a second orientation substantially perpendicular to the horizontal layer. Individual VLAAD elements of the plurality of VLAAD elements can comprise a capacitor comprising one or more lumped element component. The capacitor can comprise a variable capacitance. Individual VLAAD elements of the one or more series of interconnected VLAAD elements can be separated from adjacent VLAAD elements by a fraction of a wavelength ($\lambda_0$) of an electromagnetic excitation applied to the ACP system.

In one or more aspects, the ACP system can comprise an array of HAAMP elements distributed above (or within an effective proximity to) the boundary medium (e.g., a lossy dielectric, terrestrial medium or earth), the array of HAAMP elements comprising a plurality of HAAMP elements positioned above (or a distance from) the boundary medium. Individual HAAMP elements of the array of HAAMP elements can comprise an inductor or loops of a conductor, the inductor comprising a lumped element component. The inductor or the loops of the conductor can be coupled to a capacitor. The array of HAAMP elements can be a cylindrical array with the plurality of HAAMP elements oriented in a $\phi$-direction. The array of HAAMP elements can be a rectangular array comprising a first plurality of HAAMP elements positioned in a second orientation above medium 1 (e.g., the terrestrial medium); and a second plurality of HAAMP elements positioned in a third orientation above medium 1 (e.g., the terrestrial medium), the third orientation substantially perpendicular to the second orientation. The first orientation can be substantially the same as the second orientation.

Further example embodiments of the present disclosure include:

Example 1. An anisotropic constitutive parameter (ACP) system, comprising:
an array of ACP elements distributed above a terrestrial medium, the array of ACP elements comprising:
a first plurality of radial resistive artificial anisotropic dielectric (RRAAD) elements positioned above the terrestrial medium, the first plurality of RRAAD elements comprising one or more series of interconnected RRAAD elements extending in a first orientation, wherein the first plurality of the RRAAD elements forms a horizontal layer at a height above the terrestrial medium.

Example 2. The ACP system of example 1, wherein the array of ACP elements is a cylindrical array with each of the one or more series of interconnected RRAAD elements linearly oriented in a $\rho$-direction.

Example 3. The ACP system of example 1, wherein the array of ACP elements comprises a second horizontal layer of RRAAD elements positioned above, and substantially parallel to, the horizontal layer of RRAAD elements distributed at the height above the terrestrial medium, the second horizontal layer of RRAAD elements comprising:

a second plurality of RRAAD elements positioned above the first plurality of RRAAD elements in the horizontal layer, the second plurality of RRAAD elements comprising the one or more series of interconnected RRAAD elements extending in the first orientation.

Example 4. The ACP system of example 1, wherein the array of ACP elements comprises a second plurality of RRAAD elements positioned above the terrestrial medium, the second plurality of RRAAD elements comprising one or more series of interconnected RRAAD elements extending in a second orientation with respect to the first orientation, wherein the first plurality of the RRAAD elements and the second plurality of the RRAAD elements form the horizontal layer at the height above the terrestrial medium.

Example 5. The ACP system of example 4, wherein individual RRAAD element series of the one or more series of interconnected RRAAD elements of the first plurality of RRAAD elements comprises a plurality of RRAAD elements coupled in series by wires extending in the first orientation, and individual RRAAD element series of the one or more series of interconnected RRAAD elements of the second plurality of RRAAD elements comprises a plurality of RRAAD elements coupled in series by wires extending in the second orientation.

Example 6. The ACP system of example 4, wherein RRAAD elements of the one or more series of interconnected RRAAD elements of the first plurality of RRAAD elements and the one or more series of interconnected RRAAD elements of the second plurality of RRAAD elements are separated from adjacent elements in that series by a defined distance.

Example 7. The ACP system of example 6, wherein the defined distance is a fraction of a wavelength ($\lambda_0$) of an electromagnetic excitation applied to the ACP system.

Example 8. The ACP system of example 7, wherein the defined distance is less than or equal to $\lambda_0/10$.

Example 9. The ACP system of example 7, wherein an overall dimension of the rectangular array of RRAAD elements is $\lambda_0 \times \lambda_0$.

Example 10. The ACP system of example 7, wherein the height of the horizontal layer above the terrestrial medium is a fraction of the wavelength ($\lambda_0$).

Example 11. The ACP system of example 4, wherein the array of ACP elements is a rectangular array with the one or more series of interconnected RRAAD elements of the first plurality of RRAAD elements linearly oriented in an x-direction and the one or more series of interconnected RRAAD elements of the second plurality of RRAAD elements linearly oriented in a y-direction substantially perpendicular to the x-direction.

Example 12. The ACP system of example 11, wherein the rectangular array of RRAAD elements does not include RRAAD elements at corners of the rectangular array.

Example 13. The ACP system of example 11, wherein each individual RRAAD element of the first plurality of RRAAD elements is collocated with a corresponding individual RRAAD element of the second plurality of RRAAD elements.

Example 14. The ACP system of example 13, wherein the individual RRAAD element of the first plurality of RRAAD elements and the corresponding individual RRAAD element of the second plurality of RRAAD elements are implemented on a common substrate.

Example 15. The ACP system of example 14, wherein the individual RRAAD element of the first plurality of RRAAD elements comprises a first capacitor and a first resistor mounted on a first side of a printed circuit board (PCB) and the corresponding individual RRAAD element of the second plurality of RRAAD elements comprises a second capacitor and a second resistor mounted on a second side of the PCB.

Example 16. The ACP system of example 4, the array of ACP elements comprises a second horizontal layer of RRAAD elements positioned above, and substantially parallel to, the horizontal layer of RRAAD elements distributed at the height above the terrestrial medium, the second horizontal layer of RRAAD elements comprising:

a third plurality of RRAAD elements positioned above the first plurality of RRAAD elements in the horizontal layer, the third plurality of RRAAD elements comprising one or more series of interconnected RRAAD elements extending in the first orientation; and a fourth plurality of RRAAD elements positioned above the second plurality of RRAAD elements in the horizontal layer, the fourth plurality of RRAAD elements comprising one or more series of interconnected RRAAD elements extending in the second orientation.

Example 17. The ACP system of example 16, wherein each RRAAD element series of the one or more series of interconnected RRAAD elements of the third plurality of RRAAD elements is substantially aligned with a corresponding RRAAD element series of the one or more series of interconnected RRAAD elements of the first plurality of RRAAD elements, and each RRAAD element series of the one or more series of interconnected RRAAD elements of the fourth plurality of RRAAD elements is substantially aligned with a corresponding RRAAD element series of the one or more series of interconnected RRAAD elements of the second plurality of RRAAD elements.

Example 18. The ACP system of example 16, wherein the second horizontal layer of RRAAD elements is separated from the horizontal layer of RRAAD elements by a fraction of a wavelength ($\lambda_0$) of an electromagnetic excitation applied to the ACP system.

Example 19. The ACP system of example 18, wherein the separation between the second horizontal layer of RRAAD elements and the horizontal layer or RRAAD elements is about twice the height of the horizontal layer of RRAAD elements.

Example 20. The ACP system of example 1, wherein the array of ACP elements is distributed about a launching structure configured to excite the ACP system with an electromagnetic field at a frequency ($f_o$).

Example 21. The ACP system of example 20, wherein the array of ACP elements is distributed about one side of the launching structure.

Example 22. The ACP system of example 1, wherein individual RRAAD elements of the array of ACP elements comprise a capacitor and a resistor connected in parallel, the capacitor and resistor comprising one or more lumped element components.

Example 23. The ACP system of example 22, wherein the capacitor comprises a variable capacitance, the resistor comprises a variable resistance, or both.

Example 24. The ACP system of example 1, wherein the array of ACP elements comprises a plurality of vertical lossless artificial anisotropic dielectric (VLAAD) elements distributed above the terrestrial medium, the plurality of VLAAD elements positioned above the terrestrial medium, the plurality of VLAAD elements comprising one or more series of interconnected VLAAD elements extending in a second orientation substantially perpendicular to the horizontal layer.

Example 25. The ACP system of example 24, wherein individual VLAAD elements of the plurality of VLAAD elements comprise a capacitor comprising one or more lumped element component.

Example 26. The ACP system of example 25, wherein the capacitor comprises a variable capacitance.

Example 27. The ACP system of example 24, wherein individual VLAAD elements of the one or more series of interconnected VLAAD elements are separated from adjacent VLAAD elements by a fraction of a wavelength ($\lambda_0$) of an electromagnetic excitation applied to the ACP system.

Example 28. The ACP system of example 1, comprising an array of horizontal artificial anisotropic magnetic permeability (HAAMP) elements distributed above the terrestrial medium, the array of HAAMP elements comprising a plurality of HAAMP elements positioned above the terrestrial medium.

Example 29. The ACP system of example 28, wherein individual HAAMP elements of the array of HAAMP elements comprise an inductor or loops of a conductor, the inductor comprising a lumped element component.

Example 30. The ACP system of example 29, wherein the inductor or the loops of the conductor is coupled to a capacitor.

Example 31. The ACP system of example 28, wherein the array of HAAMP elements is a cylindrical array with the plurality of HAAMP elements oriented in a $\phi$-direction.

Example 32. The ACP system of example 28, wherein the array of HAAMP elements is a rectangular array comprising:

a first plurality of HAAMP elements positioned in a second orientation above the terrestrial medium; and a second plurality of HAAMP elements positioned in a third orientation above the terrestrial medium, the third orientation substantially perpendicular to the second orientation.

Example 33. The ACP system of example 32, wherein the first orientation is substantially the same as the second orientation.

It should be emphasized that the embodiments throughout this disclosure are examples of implementations provided to facilitate an understanding of the principles of the disclosure. Many variations and modifications may be made to the above-described aspect(s) or embodiment(s) without departing substantially from the overall principles of the disclosure. All such modifications and variations are intended to be included herein within the scope of this disclosure and protected by the following claims. In addition, all optional and preferred features and modifications of the described aspects or embodiments are usable in all aspects of the disclosure taught herein. Furthermore, the individual features of the dependent claims, as well as all optional and preferred features and modifications of the described aspects or embodiments are combinable and interchangeable with one another.

The term "substantially" is meant to permit deviations from the descriptive term that don't negatively impact the intended purpose. Descriptive terms are implicitly understood to be modified by the word substantially, even if the term is not explicitly modified by the word substantially.

Note that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A guided surface wave apparatus, comprising:
a launching transducer or a receiving transducer; and
an array of anisotropic constitutive parameter (ACP) elements distributed above a terrestrial medium and about at least a portion of the launching transducer or the receiving transducer, the array of ACP elements comprising:
a first plurality of radial resistive artificial anisotropic dielectric (RRAAD) elements positioned above the terrestrial medium, the first plurality of RRAAD elements comprising one or more linear series of interconnected RRAAD elements extending in a first orientation, wherein the first plurality of the RRAAD elements forms a horizontal layer at a height above the terrestrial medium.

2. The guided surface wave apparatus of claim 1, wherein the array of ACP elements is a cylindrical array with each of the one or more linear series of interconnected RRAAD elements linearly oriented in a ρ-direction.

3. The guided surface wave apparatus of claim 1, wherein the array of ACP elements comprises a second horizontal layer of RRAAD elements positioned above, and substantially parallel to, the horizontal layer of RRAAD elements distributed at the height above the terrestrial medium, the second horizontal layer of RRAAD elements comprising:
a second plurality of RRAAD elements positioned above the first plurality of RRAAD elements in the horizontal layer, the second plurality of RRAAD elements comprising one or more series of interconnected RRAAD elements extending in the first orientation.

4. The guided surface wave apparatus of claim 1, wherein the array of ACP elements comprises a second plurality of RRAAD elements positioned above the terrestrial medium, the second plurality of RRAAD elements comprising one or more series of interconnected RRAAD elements extending in a second orientation with respect to the first orientation, wherein the first plurality of the RRAAD elements and the second plurality of the RRAAD elements form the horizontal layer at the height above the terrestrial medium.

5. The guided surface wave apparatus of claim 4, wherein RRAAD elements of the one or more linear series of interconnected RRAAD elements of the first plurality of RRAAD elements and the one or more series of interconnected RRAAD elements of the second plurality of RRAAD elements are separated from adjacent elements in that series by a defined distance.

6. The guided surface wave apparatus of claim 4, wherein the array of ACP elements is a rectangular array with the one or more linear series of interconnected RRAAD elements of the first plurality of RRAAD elements linearly oriented in an x-direction and the one or more series of interconnected RRAAD elements of the second plurality of RRAAD elements linearly oriented in a y-direction substantially perpendicular to the x-direction.

7. The guided surface wave apparatus of claim 1, wherein the launching transducer is configured to excite the array of ACP elements with an electromagnetic field at a frequency ($f_o$) thereby substantially mode matching the electromagnetic field to a Zenneck surface wave mode of the terrestrial medium.

8. The guided surface wave apparatus of claim 1, wherein the receiving transducer is configured to couple with a Zenneck surface wave propagating along the terrestrial medium at a frequency ($f_o$) via the array of ACP elements, wherein the array of ACP elements is configured to concentrate electromagnetic energy from the Zenneck surface wave around the receiving transducer.

9. The guided surface wave apparatus of claim 1, wherein individual RRAAD elements of the array of ACP elements comprise a capacitor and a resistor connected in parallel, the capacitor and resistor comprising one or more lumped element components.

10. The guided surface wave apparatus of claim 1, wherein the array of ACP elements comprises a plurality of vertical lossless artificial anisotropic dielectric (VLAAD) elements distributed above the terrestrial medium, the plurality of VLAAD elements positioned above the terrestrial medium, the plurality of VLAAD elements comprising one or more series of interconnected VLAAD elements extending in a second orientation substantially perpendicular to the horizontal layer.

11. The guided surface wave apparatus of claim 1, comprising an array of horizontal artificial anisotropic magnetic permeability (HAAMP) elements distributed about the launching transducer or the receiving transducer, the array of HAAMP elements comprising a plurality of HAAMP elements positioned above the terrestrial medium.

12. A method, comprising:
providing a plurality of anisotropic constitutive parameter (ACP) elements about at least a portion of a launching transducer or a receiving transducer; and
configuring the plurality of ACP elements in an array above a terrestrial medium, wherein configuring the array of ACP elements comprises:
positioning a first plurality of radial resistive artificial anisotropic dielectric (RRAAD) elements above the terrestrial medium, the first plurality of RRAAD elements comprising one or more linear series of interconnected RRAAD elements extending in a first orientation, the first plurality of the RRAAD elements forming a horizontal layer at a height above the terrestrial medium.

13. The method of claim 12, further comprising:
exciting the array of ACP elements with an electromagnetic field produced by the launching transducer, the array of ACP elements configured to substantially mode match the electromagnetic field at a frequency ($f_o$) to a Zenneck surface wave mode of the terrestrial medium; and
coupling energy from the launching transducer into a Zenneck surface wave propagating along the terrestrial medium via the array of ACP elements.

14. The method of claim 12, further comprising:
concentrating, via the array of ACP elements, electromagnetic energy from a Zenneck surface wave propagating along the terrestrial medium at a frequency ($f_o$);
extracting power from the concentrated electromagnetic energy from the Zenneck surface wave via the receiving transducer; and
providing at least a portion of the extracted power to a load.

15. The method of claim 12, wherein the array of ACP elements is a cylindrical array with each of the one or more linear series of interconnected RRAAD elements linearly oriented in a ρ-direction.

16. The method of claim 12, wherein configuring the array of ACP elements comprises positioning a second plurality of RRAAD elements in a second horizontal layer above, and substantially parallel to, the horizontal layer of RRAAD elements distributed at the height above the terrestrial medium.

17. The method of claim 16, wherein the second plurality of RRAAD elements comprise one or more series of interconnected RRAAD elements extending in the first orientation.

18. The method of claim 16, wherein the second plurality of RRAAD elements comprise one or more series of interconnected RRAAD elements extending in a second orientation with respect to the first orientation.

19. The method of claim 12, wherein the array of ACP elements is a rectangular array with the one or more linear series of interconnected RRAAD elements of the first plurality of RRAAD elements linearly oriented in an x-direction and the one or more series of interconnected RRAAD elements of the second plurality of RRAAD elements linearly oriented in a y-direction substantially perpendicular to the x-direction.

20. The method of claim 12, wherein configuring the array of ACP elements comprises positioning a plurality of vertical lossless artificial anisotropic dielectric (VLAAD) elements distributed about the launching transducer or the receiving transducer, the plurality of VLAAD elements positioned above the terrestrial medium, the plurality of VLAAD elements comprising one or more series of interconnected VLAAD elements extending in a second orientation substantially perpendicular to the horizontal layer.

21. The method of claim 12, can comprise configuring an array of horizontal artificial anisotropic magnetic permeability (HAAMP) elements about the launching transducer or the receiving transducer, the array of HAAMP elements comprising a plurality of HAAMP elements positioned above the terrestrial medium.

22. A guided surface wave system, comprising:
an array of anisotropic constitutive parameter (ACP) elements distributed above a terrestrial medium and about at least a portion of a launching transducer, the array of ACP elements comprising a first plurality of radial resistive artificial anisotropic dielectric (RRAAD) elements positioned above the terrestrial medium, the first plurality of RRAAD elements comprising one or more linear series of interconnected RRAAD elements extending in a first orientation, wherein the first plurality of the RRAAD elements forms a horizontal layer at a height above the terrestrial medium, where excitation of the array of ACP elements with an electromagnetic field produced by the launching transducer at a frequency ($f_o$) substantially mode matches the electromagnetic field to a Zenneck surface wave mode of the terrestrial medium; and a receiving transducer configured to extract power from electromagnetic energy from a Zenneck surface wave propagating along the terrestrial medium from the launching transducer.

23. The guided surface wave system of claim 22, wherein the array of ACP elements comprises a second horizontal layer of RRAAD elements positioned above, and substantially parallel to, the horizontal layer of RRAAD elements distributed at the height above the terrestrial medium, the second horizontal layer of RRAAD elements comprising a second plurality of RRAAD elements positioned above the first plurality of RRAAD elements in the horizontal layer.

24. The guided surface wave system of claim 22, wherein the array of ACP elements comprises a second plurality of RRAAD elements positioned above the terrestrial medium, the second plurality of RRAAD elements comprising one or more series of interconnected RRAAD elements extending in a second orientation with respect to the first orientation, wherein the first plurality of the RRAAD elements and the second plurality of the RRAAD elements form the horizontal layer at the height above the terrestrial medium.

25. The guided surface wave system of claim 22, wherein the array of ACP elements comprises a plurality of vertical lossless artificial anisotropic dielectric (VLAAD) elements distributed above the terrestrial medium, the plurality of VLAAD elements positioned above the terrestrial medium, the plurality of VLAAD elements comprising one or more series of interconnected VLAAD elements extending in a second orientation substantially perpendicular to the horizontal layer.

26. The guided surface wave system of claim 22, comprising an array of horizontal artificial anisotropic magnetic permeability (HAAMP) elements distributed about the launching transducer, the array of HAAMP elements comprising a plurality of HAAMP elements positioned above the terrestrial medium.

27. The guided surface wave system of claim 22, comprising a second array of ACP elements distributed above the terrestrial medium about the receiving transducer, the second array of ACP elements configured to configured to concentrate the electromagnetic energy from the Zenneck surface wave around the receiving transducer, wherein the receiving transducer extracts power from the concentrated electromagnetic energy from the Zenneck surface wave.

* * * * *